US008815657B2

(12) United States Patent
Ozawa et al.

(10) Patent No.: US 8,815,657 B2
(45) Date of Patent: Aug. 26, 2014

(54) METHOD OF MANUFACTURING SEMICONDUCTOR DEVICE

(75) Inventors: Suguru Ozawa, Kyoto (JP); Atsuo Isobe, Kanagawa (JP); Takashi Hamada, Kanagawa (JP); Junpei Momo, Kanagawa (JP); Hiroaki Honda, Kanagawa (JP); Takashi Shingu, Kanagawa (JP); Tetsuya Kakehata, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 717 days.

(21) Appl. No.: 12/550,540

(22) Filed: Aug. 31, 2009

(65) Prior Publication Data

US 2010/0075470 A1   Mar. 25, 2010

(30) Foreign Application Priority Data

Sep. 5, 2008   (JP) .................. 2008-228109

(51) Int. Cl.
*H01L 21/00* (2006.01)

(52) U.S. Cl.
USPC .................. 438/151; 257/E21.568

(58) Field of Classification Search
CPC ........... H01L 27/1214; H01L 21/76254; H01L 27/1266; H01L 27/12; H01L 29/66757; H01L 29/66772
USPC ............ 438/151, 458; 257/E21.568, E21.415
See application file for complete search history.

(56) References Cited

U.S. PATENT DOCUMENTS

| | | | |
|---|---|---|---|
| 5,374,564 A | 12/1994 | Bruel | |
| 5,854,096 A | 12/1998 | Ohtani et al. | |
| 6,184,068 B1 | 2/2001 | Ohtani et al. | |
| 6,326,248 B1 | 12/2001 | Ohtani et al. | |
| 6,335,231 B1 | 1/2002 | Yamazaki et al. | |
| 6,372,609 B1 | 4/2002 | Aga et al. | |
| 6,534,380 B1 | 3/2003 | Yamauchi et al. | |
| 6,573,161 B1 | 6/2003 | Miyasaka et al. | |
| 6,589,824 B2 | 7/2003 | Ohtani et al. | |
| 6,767,799 B2 | 7/2004 | Shimomura et al. | |
| 6,919,237 B2 | 7/2005 | Ohtani et al. | |
| 7,470,575 B2 | 12/2008 | Ohtani et al. | |
| 2004/0147095 A1* | 7/2004 | Yamazaki ..................... | 438/479 |
| 2008/0149928 A1* | 6/2008 | Moriguchi et al. ............. | 257/49 |
| 2008/0246109 A1 | 10/2008 | Ohnuma et al. | |
| 2008/0261376 A1 | 10/2008 | Yamazaki et al. | |
| 2008/0268618 A1 | 10/2008 | Yamazaki | |
| 2008/0286952 A1 | 11/2008 | Miyairi et al. | |

(Continued)

FOREIGN PATENT DOCUMENTS

| | | |
|---|---|---|
| JP | 05-211128 A | 8/1993 |
| JP | 11-163363 A | 6/1999 |

(Continued)

*Primary Examiner* — Duy T Nguyen
(74) *Attorney, Agent, or Firm* — Eric J. Robinson; Robinson Intellectual Property Law Office, P.C.

(57) ABSTRACT

After a single crystal semiconductor layer provided over a base substrate by attaching is irradiated with a laser beam, characteristics thereof are improved by first heat treatment, and after adding an impurity element imparting conductivity to the single crystal semiconductor layer, second heat treatment is performed at lower temperature than that of the first heat treatment.

22 Claims, 12 Drawing Sheets

(56) References Cited

U.S. PATENT DOCUMENTS

| | | |
|---|---|---|
| 2008/0311726 A1 | 12/2008 | Ohnuma et al. |
| 2009/0004764 A1 | 1/2009 | Ohnuma et al. |
| 2009/0004878 A1 | 1/2009 | Ohnuma et al. |
| 2009/0011575 A1 | 1/2009 | Shimomura et al. |
| 2009/0017568 A1 | 1/2009 | Kakehata |
| 2009/1007546 | 3/2009 | Ohtani et al. |
| 2009/0111244 A1 | 4/2009 | Yamazaki et al. |
| 2009/0111248 A1 | 4/2009 | Ohnuma et al. |
| 2009/0115029 A1 | 5/2009 | Koyama et al. |
| 2009/0117692 A1 | 5/2009 | Koyama et al. |
| 2009/0137101 A1 | 5/2009 | Yamazaki et al. |

FOREIGN PATENT DOCUMENTS

| | | | |
|---|---|---|---|
| JP | 2000-294754 | | 10/2000 |
| JP | 200294754 | * | 10/2000 |
| JP | 2005-203596 | * | 7/2005 |
| JP | 2005-252244 A | | 9/2005 |
| JP | 2009-539257 | | 11/2009 |
| WO | WO-2006/117900 | | 11/2006 |

* cited by examiner

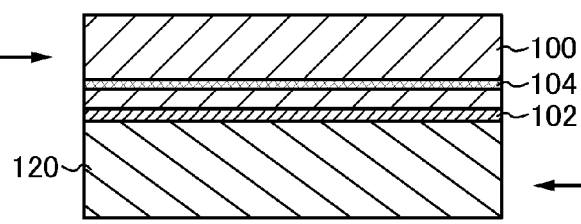
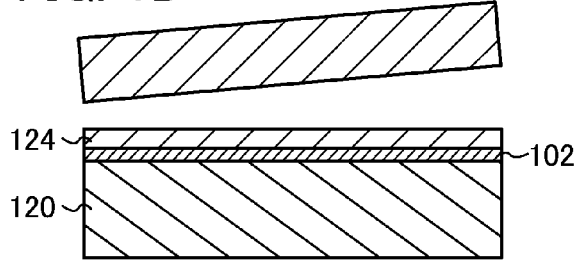
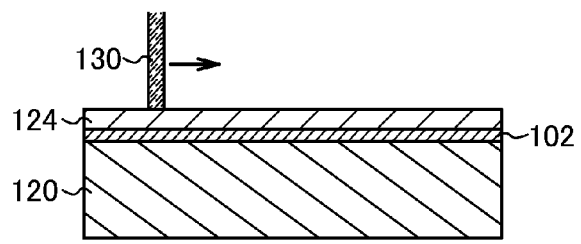
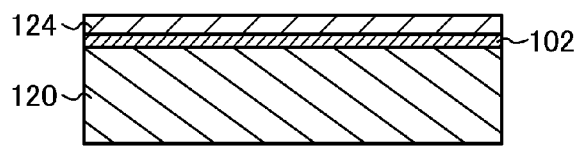

FIG. 3(A-1)
FIG. 3(B-1)
FIG. 3(A-2)
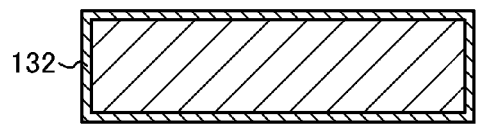
FIG. 3(B-2)
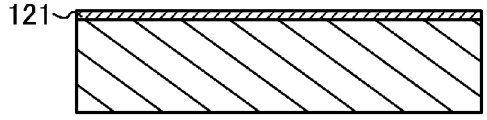
FIG. 3(A-3)
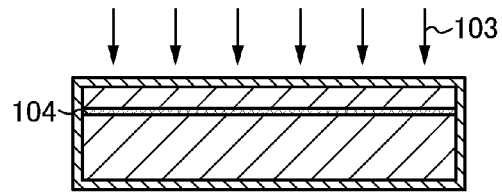
FIG. 3C
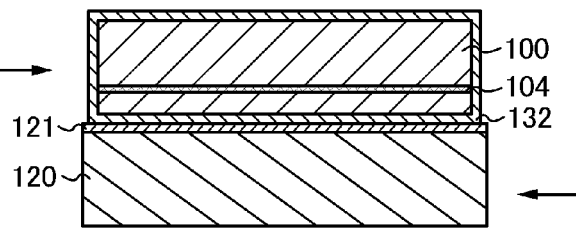
FIG. 3D
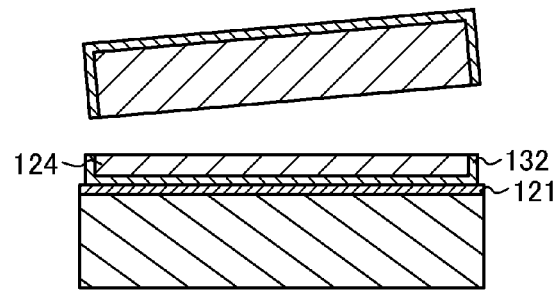

METHOD OF MANUFACTURING SEMICONDUCTOR DEVICE

BACKGROUND OF THE INVENTION

1. Field of the Invention

The present invention relates to a method of manufacturing a substrate in which a semiconductor layer is provided over an insulating layer therebetween, especially a method of manufacturing an SOI (silicon on insulator) substrate. In addition, the present invention relates to a method of manufacturing a semiconductor device using a substrate over which a semiconductor layer is provided with an insulating layer interposed therebetween.

2. Description of the Related Art

In recent years, an integrated circuit using an SOI (silicon on insulator) substrate in which a thin single crystal semiconductor layer is formed on an insulating surface, instead of a bulk silicon wafer, has been developed. Since parasitic capacitance between a drain of a transistor and a substrate is reduced by using the SOI substrate, the SOI substrate has attracted attentions as one improving performance of semiconductor integrated circuits.

Smart Cut (registered trademark) method is known as one of methods for manufacturing an SOI substrate (for example, see Patent Document 1). An outline of the method of manufacturing an SOI substrate by Smart Cut method is described below. First, hydrogen ions are implanted into a silicon wafer by an ion implantation method to form a microbubble layer at a predetermined depth from the surface. Next, the silicon wafer into which the hydrogen ions are implanted is bonded to another silicon wafer with a silicon oxide film interposed therebetween. Then, by heat treatment, the microbubble layer serves as a cleavage plane and a part of the silicon wafer into which the hydrogen ions have been implanted is separated in a thin film shape along the microbubble layer. Accordingly, a single crystal silicon film can be formed over the other bonded silicon wafer. Here, Smart Cut method may also be referred to as a hydrogen ion implantation separation method.

A method has also been proposed in which a single crystal silicon layer is formed over a base substrate made of glass by such Smart Cut method. Since glass substrates can have a larger area and are more inexpensive than silicon wafers, the glass substrates are mainly used for manufacturing liquid crystal display devices and the like. By using such a glass substrate as a base substrate, a large-sized inexpensive SOI substrate can be manufactured.

Further, in Patent Document 2, in order to improve crystal quality of a single crystal silicon layer, a method for irradiating a single crystal silicon layer with a laser beam is disclosed.

REFERENCE

Patent Document

[Patent Document 1] Japanese Patent Application No. H05-211128
[Patent Document 2] Japanese Patent Application No. 2005-252244

SUMMARY OF THE INVENTION

As shown in Patent Document 2, by irradiation of a single crystal semiconductor layer with a laser beam, even in the case where a glass substrate with low heat resistance or the like is used, the single crystal semiconductor layer is melted and thus crystallinity can be increased.

In order to ensure sufficient characteristics of the single crystal semiconductor layer here, irradiating with a laser beam with an optimal energy density is necessary; however, there are variations in time of the energy density of the laser beam. Therefore irradiating with the laser beam under a fixed condition constantly is difficult. Thus, a problem occurs in that there are variations in characteristics of a completed semiconductor device due to variations in energy density of the laser beam. That is, it has been difficult that a semiconductor device having favorable characteristics is manufactured with high yield.

Further, since the above glass substrate tends to shrink by heat treatment, there is a problem in that misalignment of a mask pattern or the like occurs, so that variations in characteristics of a semiconductor element are caused, depending on heat treatment in manufacturing a semiconductor device.

In view of the above problem, an object of one embodiment to be disclosed in the present specification and the like is to reduce variations in characteristics of a semiconductor device due to conditions of laser beam irradiation. Alternatively, another object is to reduce variations in characteristics of a semiconductor device due to heat shrink of a substrate. Alternatively, another object is to reduce variations in characteristics of a semiconductor device due to conditions of laser beam irradiation and variations in characteristics of a semiconductor device due to heat shrink of a substrate, and to improve the characteristics of the semiconductor device.

One embodiment of the present invention is that after a single crystal semiconductor layer provided over a base substrate by attaching is irradiated with a laser beam, characteristics thereof are improved by first heat treatment, and after adding an impurity element imparting conductivity to the single crystal semiconductor layer, second heat treatment is performed at lower temperature than that of the first heat treatment.

A feature of one embodiment of the present invention is a method including irradiating a single crystal semiconductor substrate with ions which are accelerated and forming an embrittlement region in a region of a predetermined depth from the surface of the single crystal semiconductor substrate; attaching the single crystal semiconductor substrate and a base substrate with an insulating layer interposed therebetween; separating the single crystal semiconductor substrate at the embrittlement region and forming a single crystal semiconductor layer over the base substrate with the insulating layer interposed therebetween; performing first heat treatment after irradiation of the single crystal semiconductor layer with a laser beam; adding an impurity element imparting conductivity to the single crystal semiconductor layer to form impurity regions in the single crystal semiconductor layer; and performing second heat treatment on the single crystal semiconductor layer in which the impurity regions are formed at lower temperature than the temperature of the first heat treatment.

In the above, the temperature of the second heat treatment is preferably set to be 550° C. or higher. In addition, the temperature of the first heat treatment is preferably set to be 640° C. or higher and lower than the strain point of the base substrate.

In the above, the impurity regions are preferably formed after a gate electrode is formed over the single crystal semiconductor layer. The impurity regions can be a source region and a drain region. Thinning treatment may be performed on the single crystal semiconductor layer after the laser beam irradiation and before the first heat treatment. As the base substrate, a glass substrate can be used.

"Single crystal" in this specification and the like means a crystal in which, when a certain crystal axis is focused on, the direction of the crystal axes in all portions of a sample is oriented in the same direction and in which a crystal grain boundary does not exist between crystals. Note that, in this specification and the like, the single crystal includes a crystal in which the direction of crystal axes is oriented in the same direction as described above and which has no grain boundaries even when it includes a crystal defect or a dangling bond. In addition, "re-single-crystallization of a single crystal semiconductor layer" means that a semiconductor layer having a single crystal structure returns to a single crystal structure after being in a different state from the single crystal structure (for example, a liquid-phase state).

Further, in this specification and the like, "activation of a source region and a drain region" means, when an impurity atom belonging to Group 13 or Group 15 is added to a semiconductor film with high resistance by various methods to obtain characteristics of p-type or n-type, in order to obtain more preferable characteristics of p-type or n-type, energy is supplied to the region to which the impurity is added to activate the impurity, and the conductivity of the film is increased.

"A semiconductor device" in this specification and the like generally indicates a device capable of functioning by utilizing semiconductor characteristics, and electro-optic devices, semiconductor circuits, and electronic appliances are all semiconductor devices.

Further, a display device in this specification and the like includes a light-emitting device and a liquid crystal display device. The light-emitting device includes a light-emitting element, and the liquid crystal display device includes a liquid crystal element. A light-emitting element includes, in its scope, an element whose luminance is controlled by a current or a voltage, and specifically includes an inorganic electro luminescence (EL) element, an organic EL element, and the like.

According to one embodiment of the invention disclosed, even in the case where irradiation energy density of a laser beam is reduced, a semiconductor device having the equivalent characteristics can be obtained. Thus, deterioration of characteristics of a semiconductor device due to variations of irradiation energy density of the laser beam can be suppressed. Alternatively, according to one embodiment of the invention disclosed, variations in characteristics of a semiconductor device due to heat shrink of a substrate can be reduced. That is, a semiconductor device having favorable characteristics can be manufactured with high yield.

BRIEF DESCRIPTION OF THE DRAWINGS

FIGS. 1A to 1F are views showing an example of a method of manufacturing a semiconductor device.

FIGS. 3(A-1) to 3(A-3), 3(B-1) and 3(B-2), 3C, and 3D are views showing an example of a method of manufacturing an SOI substrate.

DETAILED DESCRIPTION OF THE INVENTION

Figure 2A:
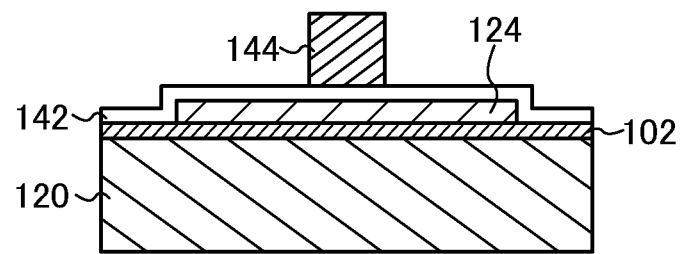
FIGS. 2A to 2C are views showing an example of a method of manufacturing a semiconductor device.

Hereinafter, embodiments will be described with reference to drawings. Note that the present invention can be implemented in various different ways and it will be readily appreciated by those skilled in the art that various changes and modifications are possible without departing from the spirit and the scope of the present invention. Therefore, the present invention should not be interpreted as being limited to the following description of the embodiments. Note that in all the drawings for describing the embodiments, the same portions or portions having similar functions are denoted by the same reference numerals, and repeated description is omitted.

Embodiment 1

This embodiment will describe an example of a method of manufacturing a semiconductor device with reference to drawings. In particular, the case of manufacturing a semiconductor device using a single crystal semiconductor layer provided over a base substrate is described.

First, a single crystal semiconductor substrate 100 and a base substrate 120 are prepared (see FIGS. 1A and 1B).

As the single crystal semiconductor substrate 100, a single crystal semiconductor substrate formed using an element of Group 14, such as a single crystal silicon substrate, a single crystal germanium substrate, or a single crystal silicon germanium substrate, can be used. Alternatively, a compound semiconductor substrate formed using such as gallium arsenide or indium phosphide, can be used. The size of a commercial silicon substrate is typically a circular substrate which is 5 inches (125 mm) in diameter, 6 inches (150 mm) in diameter, 8 inches (200 mm) in diameter, 12 inches (300 mm) in diameter, and 16 inches (400 mm) in diameter. Note that the shape of the single crystal semiconductor substrate 100 is not limited to a circular shape. For example, a single crystal semiconductor substrate processed into a rectangular shape or the like can also be used. In addition, the single crystal semiconductor substrate 100 can be manufactured by a CZ method or an FZ (floating zone) method.

As the base substrate 120, a substrate made of an insulator can be used. In particular, a variety of glass substrates that are used in the electronics industry, such as aluminosilicate glass substrates, aluminoborosilicate glass substrates, and barium borosilicate glass substrates; quartz substrates; ceramic substrates; and sapphire substrates can be used. Note that, in the above glass substrates, more boric oxide ($B_2O_3$) is contained to increase the heat resistance of the glasses generally. However, more barium oxide (BaO) is included than $B_2O_3$, so that more practical heat resistance glasses can be obtained. Therefore, a glass substrate including more BaO than $B_2O_3$ is preferably used. Alternatively, a single crystal semiconductor substrate (for example, a single crystal silicon substrate, or the like) may be used as the base substrate 120. In this embodiment, a case of using a glass substrate is described. With use of a glass substrate which can have a large area and is inexpensive as the base substrate 120, the cost can be reduced.

Next, an embrittlement region 104 whose crystal structure is damaged is formed at a predetermined depth from a surface of the single crystal semiconductor substrate 100, and then the single crystal semiconductor substrate 100 and the base substrate 120 are attached to each other with an insulating layer 102 interposed therebetween (see FIG. 1C).

The embrittlement region 104 can be formed by irradiating the single crystal semiconductor substrate 100 with ions of hydrogen having kinetic energy, or the like.

The insulating layer 102 can be formed to have a single-layer structure of a silicon oxide film, a silicon oxynitride film, a silicon nitride film, a silicon nitride oxide film, or the like, or a stacked-layer structure thereof. These films can be formed by a thermal oxidation method, a CVD method, a sputtering method, or the like.

In this specification and the like, "silicon oxynitride" refers to a substance that contains more oxygen than nitrogen, and preferably oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively in the case where measurements are performed by Rutherford backscattering spectrometry and hydrogen forward scattering. Further, silicon nitride oxide refers to a substance that contains more nitrogen than oxygen, and, oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively in the case where measurements are performed by RBS and HFS. Note that percentages of nitrogen, oxygen, silicon, and hydrogen fall within the ranges given above, where the total number of atoms contained in the silicon oxynitride or the silicon nitride oxide is defined as 100 at. %.

Next, a single crystal semiconductor layer 124 is provided over the base substrate 120 with the insulating layer 102 interposed therebetween by separation at the embrittlement region 104 using heat treatment (see FIG. 1D).

When the heat treatment is performed, the element added is separated out in microvoids which are formed in the embrittlement region 104 by the increase in the temperature, and the internal pressure of the microvoids is increased. By increasing the pressure, the microvoids in the embrittlement region 104 is changed in volume and a crack is generated in the embrittlement region 104. Thus, the single crystal semiconductor substrate 100 is separated along the embrittlement region 104. Since the insulating layer 102 is bonded to the base substrate 120, a single crystal semiconductor layer 124 which is separated from the single crystal semiconductor substrate 100 is formed over the base substrate 120.

Next, by irradiating the surface of the single crystal semiconductor layer 124 formed over the base substrate 120 with a laser beam 130, the crystallinity of the single crystal semiconductor layer 124 is recovered (recrystallization) (see FIG. 1E). Although an irradiation atmosphere of the laser beam is not particularly limited, by performing the irradiation under an inert atmosphere or a reduced pressure atmosphere, the surface planarity of the single crystal semiconductor layer 124 can be improved more than in a case of performing it under an air atmosphere.

In general, on the surface portion of the single crystal semiconductor layer 124 after the separation, crystal defects or the like are generated when the embrittlement region 104 is formed or when the separation is performed at the embrittlement region 104, or the like, and the crystallinity is damaged. Accordingly, as shown in FIG. 1E, the surface of the single crystal semiconductor layer 124 is irradiated with the laser beam 130 to melt at least the surface portion of the single crystal semiconductor layer 124, whereby the crystallinity can be recovered. In addition, the surface of the single crystal semiconductor layer 124 can be planarized with recovery of the crystallinity, by melting the surface portion of the single crystal semiconductor layer 124. Note that the crystallinity of the single crystal semiconductor layer 124 can be evaluated by observation with an optical microscope, Raman shift and a full width at half maximum which are obtained from a Raman spectroscopy spectrum, or the like.

Note that, preferably by irradiating the single crystal semiconductor layer 124 with the laser beam 130 from the surface side of the single crystal semiconductor layer 124 which is exposed by the separation, the single crystal semiconductor layer 124 is not completely melted, but is melted partially (partial melting). Partial melting refers to a melting state where the depth of the melted portion of the single crystal semiconductor layer 124 is shallower than an interface of the insulating layer 102 (the thickness of the single crystal semiconductor layer 124). That is, it refers to a state where an upper layer of the single crystal semiconductor layer 124 is melted to become a liquid phase and a lower layer thereof is not melted and remains a solid phase.

By partial melting of the single crystal semiconductor layer 124, crystal growth of the melted portion can be performed based on plane orientation of the single crystal semiconductor layer which is not melted, whereby the plane orientation of the single crystal semiconductor layer can be aligned and recrystallized, compared to the case where the single crystal semiconductor layer 124 is completely melted. Further, taking in oxygen, nitrogen, or the like from the insulating layer 102 can be suppressed by melting the single crystal semiconductor layer 124 partially.

As a laser oscillator which can be applied to this embodiment, a laser of which emission wavelength in the range from the ultraviolet light region to the visible light region is preferably selected. In addition, the wavelength of the laser beam 130 is a wavelength which is absorbed by the single crystal semiconductor layer 124. The wavelength can be determined in consideration of the skin depth of the laser beam, and the like. For example, the wavelength can be in the range of 250 nm to 700 nm inclusive.

As the laser oscillator, a pulsed laser or a continuous wave laser (CW laser) can be used. For example, in the case of a pulsed laser, a repetition rate of less than 10 MHz, and a pulse width of 10 ns to 500 ns inclusive, can be preferably used. A typical pulsed laser is an excimer laser that emits a laser beam having a wavelength of 400 nm or less. As the above excimer laser, for example, a XeCl excimer laser with a repetition rate of 10 Hz to 300 Hz inclusive, a pulse width of 25 ns, and a wavelength of 308 nm can be used. In addition, in pulsed laser beam scanning, one shot and another shot (the next shot) may be partially overlapped with each other for irradiation. By overlapping one shot and another shot in laser irradiation, partial refining of single crystals is repeated, and thereby a single crystal semiconductor layer having excellent characteristics can be obtained.

Further, the range of the energy density of the laser beam to partially melt the single crystal semiconductor layer 124 is such an energy density that the single crystal semiconductor layer 124 is not completely melted, in consideration of the wavelength of the laser beam, the skin depth of the laser beam, the thickness of the single crystal semiconductor layer 124 and the like. For example, in the case where the thickness of the single crystal semiconductor layer 124 is large, the energy to completely melt the single crystal semiconductor layer 124 is also large, and thus the range of the energy density of the laser beam can be wide. In addition, when the thickness of the single crystal semiconductor layer 124 is small, the energy to completely melt the single crystal semiconductor layer 124 is also small, and thus the energy density of the laser beam is preferably small. Note that in the case where the single crystal semiconductor layer 124 is irradiated with the laser beam while being heated, the upper limit of the range of the energy density needed for partially melting is preferably small, because completely melting of the single crystal semiconductor layer 124 can be prevented.

Next, first heat treatment is performed on the single crystal semiconductor layer 124 which is irradiated with the laser beam 130. Defects of the single crystal semiconductor layer 124 or defects at an interface between the single crystal semiconductor layer 124 and the insulating layer 102 can be repaired by the first heat treatment.

Specifically, the single crystal semiconductor layer 124 after being irradiated with the laser beam 130 contains plural defects in a region which is not melted, whereby crystal defects of the single crystal semiconductor layer 124 or the like can be repaired effectively by performing the first heat treatment at high temperature. In this embodiment, for the first heat treatment, heating temperature of the single crystal semiconductor layer 124 is set to be higher temperature than the temperature of the heat treatment of a later step, preferably 640° C. or higher, more preferably 700° C. or higher and be temperature at which the single crystal semiconductor layer 124 is not melted and which is lower than the strain point of the base substrate 120.

In addition, for the first heat treatment, a diffusion furnace, a heating furnace such as a resistance heating furnace, a rapid thermal annealing (RTA) apparatus, or the like can be used.

Note that, after irradiating the single crystal semiconductor layer 124 with the laser beam 130, the single crystal semiconductor layer 124 may be etched to be thinned. The thickness of the single crystal semiconductor layer 124 can be determined in accordance with characteristics of an element to be formed from the single crystal semiconductor layer 124. For example, the thickness may be 5 nm to 200 nm inclusive, preferably 10 nm to 70 nm inclusive.

Thinning treatment is preferably performed before the first heat treatment. The first heat treatment which is performed after the thinning treatment repairs the single crystal semiconductor layer 124 which is damaged by etching of the thinning treatment.

Note that, although the thinning treatment can be performed before irradiation of the laser beam 130, it is preferably performed after the irradiation of the laser beam 130. In the case where the single crystal semiconductor layer 124 is partially melted by the laser beam 130, a thick single crystal semiconductor layer 124 is preferable because the range of irradiation conditions such as the energy density of the laser beam can be widened. When the range of irradiation conditions of the laser beam is widened, variations in characteristics of an element manufactured using the single crystal semiconductor layer 124 which is recrystallized by being irradiated with the laser beam 130 can be reduced.

That is, the thinning treatment of the single crystal semiconductor layer 124 is preferably performed after irradiating the single crystal semiconductor layer 124 with the laser beam 130 and before the first heat treatment is performed.

Note that, a dry etching method or a wet etching method can be used for the etching in the thinning treatment as described above. Examples of etching gases that can be used in a dry etching method are as follows: chloride gases such as boron chloride, silicon chloride, or carbon tetrachloride; a chlorine gas; fluoride gases such as sulfur fluoride and nitrogen fluoride; an oxygen gas; or the like. An example of an etching solution that can be used in a wet etching method is a TMAH solution.

Next, the case where a semiconductor device is manufactured using an SOI substrate which is obtained by the above manufacturing process of FIGS. 1A to 1F is described with reference to FIGS. 2A to 2C. Note that, although the case where a transistor which the obtained single crystal semiconductor layer 124 is used for the channel formation region is shown in FIGS. 2A to 2C, without limitation.

First, a conductive film 144 is formed over the single crystal semiconductor layer 124 which is patterned to a desired shape with an insulating layer 142 interposed therebetween (see FIG. 2A). Note that the insulating layer 142 functions as a gate insulating layer and the conductive film 144 functions as a gate electrode.

Figure 2B:
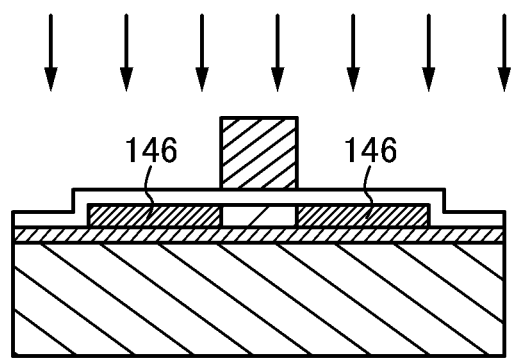

Next, an impurity element imparting conductivity type is added to the single crystal semiconductor layer 124 through the conductive film 144 to form impurity regions 146 in the single crystal semiconductor layer 124 (see FIG. 2B). As the impurity element, an impurity element imparting n-type conductivity or an impurity element imparting p-type conductivity can be used. As the impurity element imparting n-type conductivity, phosphorus (P), arsenic (As), or the like can be used. As the impurity element imparting p-type conductivity, boron (B), aluminum (Al), gallium (Ga), or the like can be used. Note that the impurity regions 146 function as a source region and a drain region of the transistor.

Figure 2C:
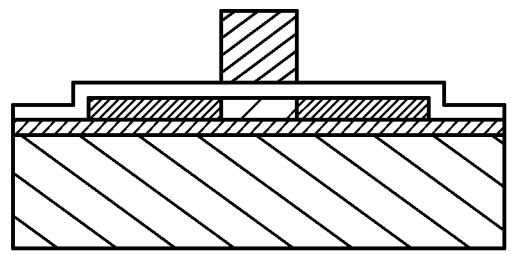

Next, second heat treatment is performed on the single crystal semiconductor layer 124 provided with the impurity regions 146 to activate the impurity regions 146 (see FIG. 2C). Although the crystal structure of the impurity regions 146 is destroyed by the addition of the impurity element, the crystal structure can be repaired by performing the second heat treatment. Specifically, in the case where the impurity regions 146 functions as a source region and a drain region, crystal defects in the vicinity of a boundary between the channel formation region and the source region, or between the channel formation region and the drain region can be repaired sufficiently. As a result, off current of the transistor can be reduced and on/off ratio of the transistor can be improved.

In this embodiment, the heating temperature of the single crystal semiconductor layer 124 is set to be 550° C. or higher and lower temperature than the temperature of the first heat treatment. For the second heat treatment, a diffusion furnace, a heating furnace such as a resistance heating furnace, a rapid thermal annealing (RTA) apparatus, or the like can be used.

In general, in the case where a glass substrate is used as the base substrate 120, the base substrate 120 shrinks because of heat treatment. Further, as temperature of heat treatment becomes higher, the base substrate 120 shrinks more significantly. Furthermore, after the first heat treatment is performed at high temperature once, in the case where the heat treatment is performed at lower temperature than that of the first heat treatment, shrink of the base substrate 120 can be significantly reduced. Therefore, in the first heat treatment (a stage before a step of forming an element such as the transistor), the temperature applied to the base substrate 120 is higher than the temperature applied to the base substrate 120 in the second heat treatment, whereby shrink of the base substrate 120 can be suppressed in the second heat treatment.

Meanwhile, the base substrate 120 shrinks in the first heat treatment in some cases. Because it is before an element such as a gate electrode is formed, problems of alignment due to shrink of the substrate in the case where a light exposure apparatus such as a stepper is used, or the like, do not occur. In addition, in order to suppress the defective alignment due to the shrink of the substrate, it is preferable that patterning the single crystal semiconductor layer 124 be performed after the first heat treatment.

In this manner, the heating temperature of the second heat treatment is lower than that of the first heat treatment, whereby deterioration of element characteristics or variations in element characteristics due to the defective alignment can be suppressed.

In addition, the heating temperature of the second heat treatment is lower than that of the first heat treatment, whereby the impurity regions can be activated while keeping film qualities of a semiconductor film or an insulating film stable. Thus, deterioration of element characteristics or variations in element characteristics can be suppressed. Note that, in the cases where the heating temperature of the second heat treatment is equal to or higher than that of the first heat treatment, element characteristics might be deteriorated. However, this is considered to result from destabilization of the film quality and the interface of the semiconductor film by the second heat treatment, for example hydrogen which terminates dangling bonds in the semiconductor film or of the interface between the semiconductor film and the insulating film is desorbed.

Note that, in this embodiment, although an example where the source region and the drain region serve as the impurity regions 146 formed in the single crystal semiconductor layer 124 is given, the impurity regions 146 is not limited to source regions and drain regions. For example, the impurity regions 146 may be formed to be use as an electrode forming a capacitor element.

Note that the structure described in this embodiment can be employed by being combined as appropriate with any structure described in the other embodiments in this specification.

Embodiment 2

This embodiment will describe an example of attaching the single crystal semiconductor substrate 100 to the base substrate 120 with reference to drawings.

First, the single crystal semiconductor substrate 100 is prepared (see FIG. 3(A-1)). It is preferable that the surface of the single crystal semiconductor substrate 100 be cleaned using a sulfuric acid/hydrogen peroxide mixture (SPM), an ammonium hydroxide/hydrogen peroxide mixture (APM), a hydrochloric acid/hydrogen peroxide mixture (HPM), dilute hydrogen fluoride (DHF), or the like as appropriate in advance in terms of removing contaminations. Alternatively, dilute hydrogen fluoride and ozone water may be discharged alternately to clean the surface of the single crystal semiconductor substrate 100.

Next, an oxide film 132 is formed on the surface of the single crystal semiconductor substrate 100 (see FIG. 3(A-2)).

As the oxide film 132, for example, a single layer of a silicon oxide film, a silicon oxynitride film, or the like, or a stacked layer thereof can be used. These films can be formed by a thermal oxidation method, a CVD method, a sputtering method, or the like. In addition, in the case where the oxide film 132 is formed by a CVD method, it is preferable to use a silicon oxide film formed by using organosilane such as tetraethoxysilane (abbreviation: TEOS, chemical formula: $Si(OC_2H_5)_4$) as the oxide film 132 in terms of productivity.

In this embodiment, thermal oxidation treatment is performed on the single crystal semiconductor substrate 100 to form the oxide film 132 (here, a SiOx film) (see FIG. 3(A-2)).

As the thermal oxidation treatment, oxidation in an oxidation atmosphere to which halogen is added is preferably performed.

For example, the thermal oxidation treatment is performed on the single crystal semiconductor substrate 100 in an oxidation atmosphere to which chlorine (Cl) is added, whereby the oxide film 132 is formed through chlorine oxidation. In this case, the oxide film 132 is a film containing a chlorine atom.

The chlorine atom which is contained in the oxide film 132 forms a distortion. As a result, the ratio of absorption of moisture of the oxide film 132 is increased and the diffusion speed is increased. That is, in the case moisture exists on the surface of the oxide film 132, moisture on the surface can be rapidly absorbed and diffused into the oxide film 132.

As an example of a thermal oxidation treatment, thermal oxidation can be performed in an oxidation atmosphere containing hydrogen chloride (HCl) at 0.5 vol % to 10 vol % (preferably 2 vol %) with respect to oxygen, at a temperature of 900° C. to 1150° C. (typically, 1000° C.). Treatment time may be 0.1 to 6 hours, preferably 0.5 to 1 hour. The thickness of the formed oxide film is 10 nm to 1000 nm (preferably, 50 nm to 300 nm), for example, 100 nm.

In this embodiment, the chlorine atom concentration included in the oxide film 132 is controlled to be $1 \times 10^{17}$ atoms/cm$^3$ to $1 \times 10^{21}$ atoms/cm$^3$. A chlorine atom is contained in the oxide film 132, whereby a heavy metal (such as Fe, Cr, Ni, or Mo) which is an extrinsic impurity is captured and thus the single crystal semiconductor substrate 100 can be prevented from being contaminated.

When halogen such as chlorine is contained in the oxide film 132 by HCl oxidation, or the like, an impurity which gives an adverse effect to the single crystal semiconductor substrate (for example, a mobile ion such as Na) can be gettered. That is, by the heat treatment performed after the oxide film 132 is formed, an impurity contained in the single crystal semiconductor substrate is separated out to the oxide film 132 and reacted with halogen (for example, chlorine) to be captured. Thus, the impurity captured in the oxide film 132 can be fixed and contamination of the single crystal semiconductor substrate 100 can be prevented. In addition, when the oxide film 132 is attached to a glass substrate, the oxide film 132 functions as a film which fixes an impurity such as Na contained in glass.

Specifically, for example, in the case where a semiconductor substrate is not cleaned sufficiently, or the case where contaminant of a semiconductor substrate which is reused repeatedly, it is effective that halogen such as chlorine is contained in the oxide film 132 by HCl oxidation, or the like.

Further, a halogen atom contained in the oxide film 132 is not limited to the chlorine atom. A fluorine atom may be contained in the oxide film 132. As a method for performing fluorine oxidation on the surface of the single crystal semiconductor substrate 100, a method where thermal oxidation treatment is performed on the surface of the single crystal semiconductor substrate 100 in an oxidation atmosphere after the single crystal semiconductor substrate 100 is immersed in an HF solution, a method where oxidation treatment is conducted in an oxidation atmosphere to which $NF_3$ is added, or the like, can be employed.

Next, the single crystal semiconductor substrate 100 is irradiated with ions having kinetic energy to form the embrittlement region 104 having a damaged crystal structure at a predetermined depth in the single crystal semiconductor substrate 100 (see FIG. 3(A-3)). As shown in FIG. 3(A-3), the single crystal semiconductor substrate 100 is irradiated with accelerated ions 103 through the oxide film 132, and the ions 103 are added to a region of a predetermined depth from the surface of the single crystal semiconductor substrate 100 to form the embrittlement region 104. The ions 103 are obtained in such a manner that a source gas is excited to produce plasma of the source gas and the ions contained in the plasma are extracted from the plasma by an electric field effect and accelerated.

The depth of the region where the embrittlement region 104 is formed can be adjusted by the kinetic energy, the mass, the charge, and the incidence angle of the ions 103. The kinetic energy can be adjusted by an acceleration voltage, a dose, or the like. In addition, the embrittlement region 104 is formed at the same depth or substantially the same depth as the average depth at which the ions 103 have entered. Therefore, the thickness of the single crystal semiconductor layer separated from the single crystal semiconductor substrate 100 is determined by the depth to which the ions 103 are added. The depth at which the embrittlement region 104 is formed is adjusted so that the thickness of the single crystal semiconductor layer becomes 10 nm to 500 nm inclusive, preferably 50 nm to 200 nm inclusive.

The embrittlement region 104 can be formed by ion doping treatment. The ion doping treatment can be performed using an ion doping apparatus. A typical ion doping apparatus is a non-mass-separation type apparatus for irradiating an object to be processed which is disposed in a chamber with all kinds of ions which are generated by plasma excitation of a process gas. In the apparatus, an object is irradiated without mass separation of ion species in plasma. In contrast, an ion implantation apparatus is a mass-separation apparatus. The ion implantation apparatus is an apparatus for irradiating an object with ion species having a specific mass with mass separation of ion species in plasma.

Main components of the ion doping apparatus are as follows: a chamber in which an object is disposed; an ion source for generating desired ions; and an acceleration mechanism for acceleration of ions and for irradiation therewith. The ion source includes a gas supply device for supplying a source gas to generate a desired ion species, an electrode for exciting the source gas to generate plasma, and the like. As the electrode for generating plasma, a filament type electrode, a capacitive coupling high-frequency discharging electrode, or the like is used. The acceleration mechanism includes electrodes such as an extraction electrode, an acceleration electrode, a deceleration electrode, and a ground electrode; a power supply for supplying power to these electrodes; and the like. These electrodes that are included in the acceleration mechanism are provided with a plurality of openings or slits, through which ions that are generated in the ion source are accelerated. Note that the components of the ion doping apparatus are not limited to the above-mentioned components, and a mechanism as needed is provided.

In this embodiment, hydrogen is added to the single crystal semiconductor substrate 100 by an ion doping apparatus. A hydrogen-containing gas is supplied as a plasma source gas. For example, $H_2$ is supplied. Plasma is generated by excitation of a hydrogen gas. Ions contained in plasma are accelerated without mass separation and the single crystal semiconductor substrate 100 is irradiated with the accelerated ions.

In the ion doping apparatus, the percentage of $H_3^+$ to the total quantity of ion species ($H^+$, $H_2^+$, and $H_3^+$) generated from a hydrogen gas is set to be 50% or higher. Preferably, the percentage of $H_3^+$ is set to be 80% or higher. Since mass separation is not performed in the ion doping apparatus, the percentage of one kind ($H_3^+$) to plural kinds of ion species generated in plasma is preferably set to be 50% or higher, more preferably 80% or higher. By irradiation with ions having the same mass, ions can be added in a concentrated manner to the same depth in the single crystal semiconductor substrate 100.

In order to form the embrittlement region 104 in a shallow region, the accelerating voltage of the ions 103 should be low. However, by increasing the percentage of $H_3^+$ ions in the plasma, atomic hydrogen (H) can be added to the single crystal semiconductor substrate 100 efficiently. Since the mass of $H_3^+$ ions is three times as large as that of $H^+$ ions, in the case where one hydrogen atom is added to the same depth, the acceleration voltage of $H_3^+$ ions can be three times as high as that of $H^+$ ions. When the acceleration voltage of ions can be increased, the takt time of an ion irradiation step can be shortened, and productivity and throughput can be improved.

Ion doping apparatuses are inexpensive and excellent for use in large-area treatment. Therefore, by irradiation with $H_3^+$ by use of such an ion doping apparatus, significant effects such as an improvement in semiconductor characteristics, an increase in area, a reduction in costs, and an improvement in productivity can be obtained. Further, in the case where an ion doping apparatus is used, there is a concern that a heavy metal is introduced to the substrate at the same time. However, by irradiation with the ions through the oxide film 132 containing a chlorine atom, contamination due to such a heavy metal of the single crystal semiconductor substrate 100 can be prevented.

Note that the step of irradiating the single crystal semiconductor substrate 100 with the ions 103 which are accelerated can also be performed by an ion implantation apparatus. The ion implantation apparatus is a mass-separation apparatus by which an object that is disposed in a chamber is irradiated with a specific ion species through mass separation of a plurality of ion species that are generated by plasma excitation of a source gas. Thus, in the case where an ion implantation apparatus is used, $H^+$ ions and $H_2^+$ ions that are generated by excitation of a hydrogen gas or a $PH_3$ gas are subjected to mass separation, and either $H^+$ ions or $H_2^+$ ions are accelerated, with which the single crystal semiconductor substrate 100 is irradiated.

Note that, as for samples which are irradiated with the ions using an ion doping method or an ion implantation method, when the surface roughness of the semiconductor layers thereof after the separation is investigated, the surface planarity of the semiconductor layers tends to be high in the case of using an ion doping method, compared with the case of using an ion implantation method. This is considered to result from a difference in the temperature rises of the samples depending on a difference between an ion doping method and an ion implantation method. Note that $H_3^+$ ions and $He^+$ ions are preferably added to the substrate at the same time by an ion doping method in terms of suppressing the surface roughness.

Next, the base substrate 120 is prepared (see FIG. 3(B-1)).

As the base substrate 120, a substrate made of an insulator is used. In particular, a variety of glass substrates that are used in the electronics industry, such as aluminosilicate glass substrates, aluminoborosilicate glass substrates, and barium borosilicate glass substrates; quartz substrates; ceramic substrates; and sapphire substrates can be used. In this embodiment, a glass substrate is used. With use of a glass substrate which can have a large area and is inexpensive as the base substrate 120, a cost can be reduced.

In addition, it is preferable that the surface of the base substrate 120 be cleaned in advance before the base substrate 120 is used. In particular, ultrasonic cleaning is performed on the base substrate 120 using a hydrochloric acid/hydrogen peroxide mixture (HPM), a sulfuric acid/hydrogen peroxide mixture (SPM), an ammonium hydroxide/hydrogen peroxide mixture (APM), diluted hydrogen fluoride (DHF), or the like. For example, ultrasonic cleaning is preferably performed on the surface of the base substrate 120 using a hydrochloric acid/hydrogen peroxide mixture. The surface of the base substrate 120 can be planarized and abrasive particles left on the surface of the base substrate 120 can be removed by performing such cleaning treatment.

Next, a nitrogen-containing layer 121 (for example, an insulating layer containing nitrogen such as a silicon nitride film (SiNx) or a silicon nitride oxide film (SiNxOy) (x>y)) is formed on the surface of the base substrate 120 (see FIG. 3(B-2)).

In this embodiment, the nitrogen-containing layer 121 becomes a layer bonded to the oxide film 132 (a bonding layer) which is provided over the single crystal semiconductor substrate 100. In addition, when the single crystal semiconductor layer having a single crystal structure is provided over the base substrate later, the nitrogen-containing layer 121 functions as a barrier layer for preventing impurities such as sodium (Na) contained in the base substrate from diffusing into the single crystal semiconductor layer.

In addition, since the nitrogen-containing layer 121 is used as the bonding layer, the surface of the nitrogen-containing layer 121 is preferably smoothed in order to suppress defective bonding. Specifically, the nitrogen-containing layer 121 is formed such that an average surface roughness (Ra) of the surface of the nitrogen-containing layer 121 is 0.5 nm or less and a root-mean-square surface roughness (Rms) is 0.60 nm or less; more preferably, Ra is 0.35 nm or less and Rms is 0.45 nm or less. The thickness is preferably in the range of 10 nm to 200 nm inclusive, more preferably, 50 nm to 100 nm inclusive.

Next, the surface of the single crystal semiconductor substrate 100 and the surface of the base substrate 120 are made to face each other, and the surface of the oxide film 132 and the surface of the nitrogen-containing layer 121 are bonded to each other (see FIG. 3C).

Here, a pressure of approximately 1 N/cm$^2$ to 500 N/cm$^2$, more preferably approximately 1 N/cm$^2$ to 20 N/cm$^2$ is applied to one part of the single crystal semiconductor substrate 100 after the single crystal semiconductor substrate 100 and the base substrate 120 are disposed in close contact with the oxide film 132 and the nitrogen-containing layer 121 interposed therebetween. A bonding between the oxide film 132 and the nitrogen-containing layer 121 begins at the pressed portion and then the spontaneous bonding proceeds entirely. This bonding step is performed by Van der Waals force or hydrogen bond at the normal temperature without heat treatment. Therefore, a substrate with low heat resistance temperature, such as a glass substrate, can be used as the base substrate 120.

Note that before the single crystal semiconductor substrate 100 is attached to the base substrate 120, surface treatment is preferably performed on the oxide film 132 formed over the single crystal semiconductor substrate 100 and the nitrogen-containing layer 121 formed over the base substrate 120.

As the surface treatment, plasma treatment, ozone treatment, megasonic cleaning, two fluid cleaning (a method of spraying functional water such as pure water or water including hydrogen with a carrier gas such as nitrogen), or a combination of these methods can be employed. Specifically, after plasma treatment is performed on at least one of the surfaces of the oxide film 132 and the nitrogen-containing layer 121, by ozone treatment, megasonic cleaning, two fluid cleaning, or the like, dust such as an organic substance on the surfaces of the oxide film 132 and the nitrogen-containing layer 121 can be removed and made hydrophilic. As a result, the bonding strength of the oxide film 132 and the nitrogen-containing layer 121 can be increased.

Here, an example of ozone treatment is described. For example, ozone treatment can be performed on the surface of the object by irradiation with ultraviolet (UV) under an atmosphere containing oxygen. The ozone treatment of ultraviolet irradiation under the atmosphere containing oxygen is also referred to UV ozone treatment, ultraviolet ozone treatment, or the like. Under the atmosphere containing oxygen, by irradiating with light having a wavelength which is less than 200 nm and light having a wavelength which is 200 nm or more of ultraviolet rays, ozone can be generated and singlet oxygen can be generated from ozone. By irradiation with light having a wavelength which is less than 180 nm of ultraviolet rays, ozone can be generated and singlet oxygen can be generated from ozone.

A reaction example is shown, which is occurred by irradiating with light having a wavelength which is less than 200 nm and light having a wavelength 200 nm or more under an atmosphere containing oxygen.

  (1)

  (2)

  (3)

In the above reaction formula (1), by irradiation with light (hv) having a wavelength which is less than 200 nm ($\lambda_1$ nm) under an atmosphere containing oxygen ($O_2$), an oxygen atom ($O(^3P)$) at a ground state is generated. Next, in a reaction formula (2), an oxygen atom ($O(^3P)$) at a ground state and oxygen ($O_2$) are reacted with each other to generate ozone ($O_3$). Then, in a reaction formula (3), by irradiating with light having a wavelength which is 200 nm or more ($\lambda_2$ nm) under an atmosphere containing the generated ozone ($O_3$), singlet oxygen O ($^1D$) in an excited state is generated. Under the atmosphere containing oxygen, by irradiation with light having a wavelength which is less than 200 nm, ozone can be generated. By irradiating with light having a wavelength which is 200 nm or more, ozone is decomposed and singlet oxygen is generated. The ozone treatment as described above can be performed, for example, by irradiation using a low-pressure mercury lamp ($\lambda_1$ is 185 nm and $\lambda_2$ is 254 nm.) under an atmosphere containing oxygen.

Further, a reaction example is shown, which is occurred by irradiation with light having a wavelength which is less than 180 nm under an atmosphere containing oxygen.

  (4)

  (5)

  (6)

In the above reaction formula (4), by irradiation with light having a wavelength which is less than 180 nm ($\lambda_3$ nm) under an atmosphere containing oxygen ($O_2$), singlet oxygen O ($^1D$) in an excited state and an oxygen atom ($O(^3P)$) at a ground state are generated. Next, in a reaction formula (5), an oxygen atom at a ground state ($O(^3P)$) and oxygen ($O_2$) are reacted with each other to generate ozone ($O_3$). In a reaction formula (6), by irradiating with light having a wavelength which is less than 180 nm ($\lambda_3$ nm) under an atmosphere containing the generated ozone ($O_3$), singlet oxygen in an excited state and oxygen are generated. Under an atmosphere containing oxygen, by irradiating with light having a wavelength which is less than 180 nm of ultraviolet rays, ozone can be generated, and at the same time ozone or oxygen is decomposed to generate singlet oxygen. The ozone treatment as described above can be performed, for example, by irradiation using a Xe excimer UV lamp ($\lambda_3$ is 172 nm.) under the atmosphere containing oxygen.

Chemical bond of an organic substance or the like attached to the surface of the object is cut by light having a wavelength which is less than 200 nm, and the organic substance attached to the surface of the object by ozone or singlet oxygen which is generated from ozone, the organic substance which cuts the chemical bond, or the like can be removed through oxidative decomposition. Hydrophilic and clean level of the surface of the object can be improved and a bonding can be preferably performed by the ozone treatment as described above.

Ozone is generated by irradiation with ultraviolet under an atmosphere containing oxygen. Ozone has an effect of removing an organic substance attached to the surface of the object. In addition, singlet oxygen has also an effect of removing an organic substance attached to the surface of the object, which is the same as or more than ozone does. Ozone and single oxygen are examples of oxygen in an active state, and are generally referred to as active oxygen. As described in the above reaction formulas, and the like, since there is a reaction in which ozone is generated in generating singlet oxygen, or in which singlet oxygen is generated from ozone, here reactions including a reaction to which singlet oxygen contributes are referred to as ozone treatment for convenience.

It is preferable that after the oxide film 132 and the nitrogen-containing layer 121 are bonded to each other, heat treatment is performed to increase the bonding strength thereof. The heat treatment temperature is set at a temperature which does not cause a crack in the embrittlement region 104, for example, a room temperature or higher and less than 400° C. preferably. Alternatively, while heating at a temperature in the range, the oxide film 132 and the nitrogen-containing layer 121 may be bonded to each other. For the heat treatment, a diffusion furnace, a heating furnace such as a resistance heating furnace, a rapid thermal annealing (RTA) apparatus, a microwave heating apparatus, or the like can be used.

In general, heat treatment is performed at the same time as or after the bonding of the oxide film 132 and the nitrogen-containing layer 121, whereby dehydration reaction proceeds at the bonding interface and the bonding interfaces come closer. Thus, the bonding is strengthened by strengthening hydrogen bond or forming a covalent bond. In order to promote dehydration reaction, moisture which is generated at the bonding interface by the dehydration reaction should be removed by high-temperature heat treatment. That is, in the case where the heat treatment temperature after the bonding is low, since moisture which is generated at the bonding interface by the dehydration reaction cannot be removed efficiently, the dehydration reaction does not proceed and it is difficult to increase the bonding strength sufficiently.

On the other hand, in the case an oxide film containing such as a chlorine atom is used as the oxide film 132, the oxide film 132 absorbs and diffuses moisture, whereby moisture which is generated at the interface bonding by the dehydration reaction can be absorbed and diffused into the oxide film 132 and thus the dehydration reaction can be promoted, even in the case where the heat treatment after the bonding is performed at a low temperature. In this case, even in the case where a substrate with low heat resistance such as a glass substrate is used as the base substrate 120, the bonding strength of the oxide film 132 and the nitrogen-containing layer 121 can be increased sufficiently. Further, plasma treatment is performed by applying a bias voltage, whereby micropores are formed near the surface of the oxide film 132 to absorb and diffuse moisture efficiently. Thus, the bonding strength of the oxide film 132 and the nitrogen-containing layer 121 can be increased, even by a low-temperature heat treatment.

Next, heat treatment is performed to cause separation at the embrittlement region 104, whereby the single crystal semiconductor layer 124 is formed over the base substrate 120 with the oxide film 132 and the nitrogen-containing layer 121 interposed therebetween (see FIG. 3D).

When the heat treatment is performed, the element added is separated out in microvoids which are formed in the embrittlement region 104 by the temperature rise, and the internal pressure of the microvoids is increased. By increasing the pressure, the microvoids in the embrittlement region 104 are changed in volume and a crack is generated in the embrittlement region 104. Thus, the single crystal semiconductor substrate 100 is separated along the embrittlement region 104. Since the insulating layer 102 is bonded to the base substrate 120, a single crystal semiconductor layer 124 which is separated from the single crystal semiconductor substrate 100 is formed over the base substrate 120. Further, the temperature in the heat treatment is set so as not to exceed the strain point of the base substrate 120.

For this heat treatment, a diffusion furnace, a heating furnace such as a resistance heating furnace, a rapid thermal annealing (RTA) apparatus, a microwave heating apparatus, or the like can be used. For example, in the case where RTA apparatus is used, the heat treatment can be performed at a heating temperature of 550° C. to 730° C. inclusive, within a process time of 0.5 minutes to 60 minutes inclusive.

Note that by the heat treatment in FIG. 3D is performed without heat treatment for increasing the bonding strength of the base substrate 120 and the oxide film 132 as described above, heat treatment step of increasing the bonding strength of the oxide film 132 and the nitrogen-containing layer 121, and heat treatment step of separating at the embrittlement region 104 may be performed at the same time.

Through the above steps, an SOI substrate can be manufactured where the single crystal semiconductor layer 124 is provided over the base substrate 120 with the oxide film 132 and the nitrogen-containing layer 121 interposed therebetween. With the manufacturing method described in this embodiment, even in the case where the nitrogen-containing layer 121 is used as the bonding layer, the bonding strength of the base substrate 120 and the single crystal semiconductor layer 124 can be increased and reliability can be increased. As a result, diffusion of impurities into the single crystal semiconductor layer 124 formed over the base substrate 120 can be suppressed and at the same time, an SOI substrate in which the base substrate 120 and the single crystal semiconductor layer 124 are disposed in close contact firmly can be formed.

Further, a nitrogen-containing layer is provided on the base substrate side and an oxide film including halogen such as chlorine is formed on the semiconductor substrate side, whereby a manufacturing process can be simplified and impurity elements can be prevented from entering the semiconductor substrate before the semiconductor substrate is attached to the base substrate. Furthermore, by forming an oxide film including halogen such as chlorine as the bonding layer provided on the semiconductor substrate side, even in the case where heat treatment after the bonding is performed at low temperature, dehydration reaction is promoted, so that the bonding strength can be increased.

After that, as described in the above embodiment 1, the single crystal semiconductor layer 124 is irradiated with the laser beam, whereby the crystallinity of the single crystal semiconductor layer 124 can be recovered. Then, after the first heat treatment, the impurity regions may be formed in the single crystal semiconductor layer 124 and the second heat treatment may be performed. Note that irradiation step of the laser beam, the first heat treatment step and the second heat treatment step can be performed using any of the methods as described in the above embodiments.

Note that, although in this embodiment, the case where the oxide film 132 is formed over the single crystal semiconductor substrate 100, and the nitrogen-containing layer 121 is formed over the base substrate 120 is described, the present invention is not limited thereto. For example, the oxide film 132 and the nitrogen-containing layer may be stacked in this order over the single crystal semiconductor substrate 100, the surface of the nitrogen-containing layer formed over the oxide film 132 and the surface of the base substrate 120 may be bonded to each other. In this case, the nitrogen-containing layer may be provided before or after forming the embrittlement region 104. Note that an oxide film (for example, silicon oxide) may be formed over the nitrogen-containing layer, and the surface of the oxide film and the surface of the base substrate 120 may be bonded to each other.

Note that, in the case where there is not a problem in that an impurity enters the single crystal semiconductor layer 124 from the base substrate 120, the surface of the oxide film 132 provided over the single crystal semiconductor substrate 100 and the surface of the base substrate 120 may be bonded to each other without providing the nitrogen-containing layer 121 over the base substrate 120.

Note that the structure described in this embodiment can be employed by being combined as appropriate with any structure in the other embodiments in this specification.

Embodiment 3

This embodiment will describe a method of manufacturing a semiconductor device having a transistor, using the SOI substrate manufactured according to the above embodiments.

First, a method for manufacturing an n-channel thin film transistor and a p-channel thin film transistor will be described with reference to FIGS. 4A to 4D and FIGS. 5A to 5C. Various kinds of semiconductor devices can be formed by combining a plurality of thin film transistors (TFTs).

This embodiment will describe the case where the SOI substrate manufactured using the process of FIGS. 3(A-1) to 3(A-3), 3(B-1) and 3(B-2), 3C, and 3D is used as an SOI substrate. Needless to say, an SOI substrate which is manufactured using any other method described in the above embodiments can be used.

Figure 4A:
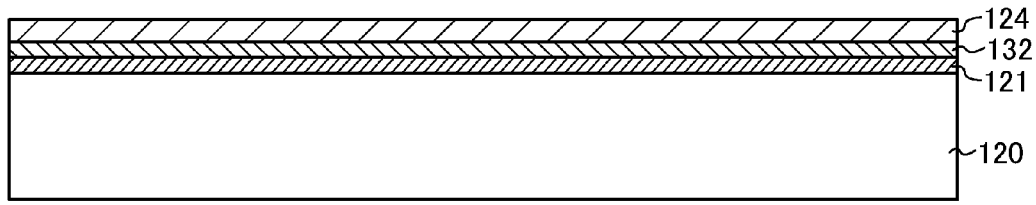
FIGS. 4A to 4D are views showing an example of a method of manufacturing a semiconductor device.

FIG. 4A is a cross-sectional view of the SOI substrate which is manufactured using the method described in FIGS. 3(A-1) to 3(A-3), 3(B-1) and 3(B-2), 3C, and 3D.

Figure 4B:
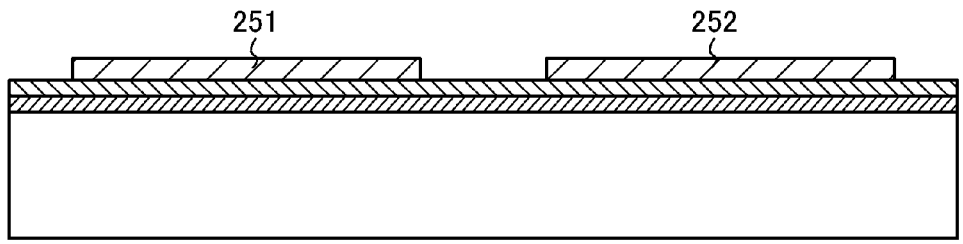

First, the single crystal semiconductor layer 124 is separated into elements by etching to form semiconductor layers 251 and 252 as shown in FIG. 4B. The semiconductor layer 251 is used for an n-channel TFT, and the semiconductor layer 252 is used for a p-channel TFT.

Figure 4C:
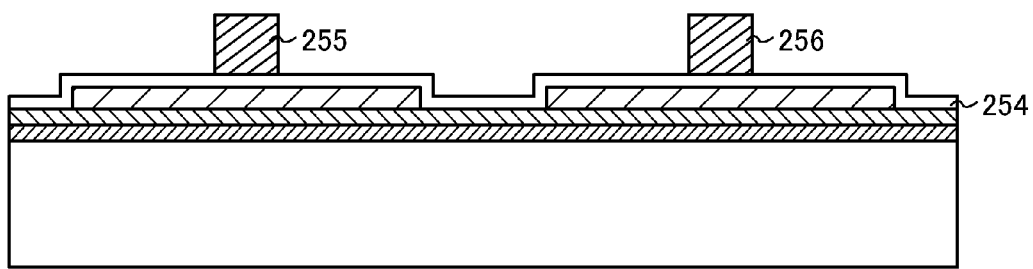

As shown in FIG. 4C, an insulating film 254 is formed over the semiconductor layers 251 and 252. Next, gate electrodes 255 and 256 are formed over the semiconductor layers 251 and 252 respectively with the insulating film 254 interposed therebetween.

Note that, before the single crystal semiconductor layer 124 is etched, it is preferable to add an impurity element such as boron, aluminum, or gallium, or an impurity element such as phosphorus or arsenic to the single crystal semiconductor layer 124 in order to control the threshold voltage of the TFTs. For example, an impurity element is added to a region where an n-channel TFT is to be formed, and another impurity element is added to a region where a p-channel TFT is to be formed.

Figure 4D:
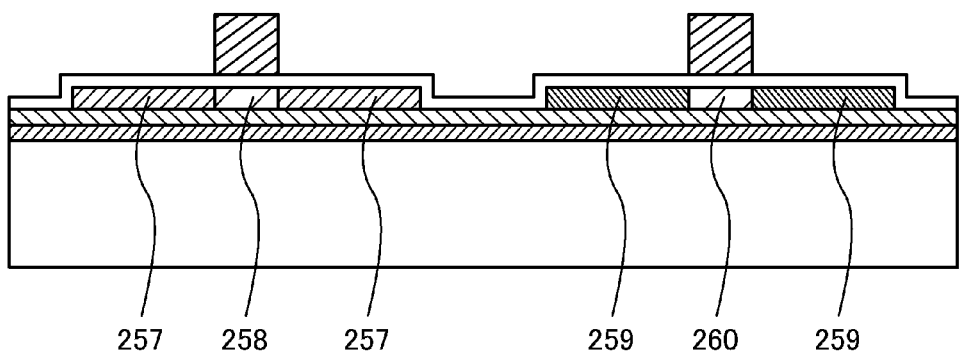

Next, as shown in FIG. 4D, n-type low-concentration impurity regions 257 are formed in the semiconductor layer 251, and p-type high-concentration impurity regions 259 are formed in the semiconductor layer 252. In particular, first, the n-type low-concentration impurity regions 257 are formed in the semiconductor layer 251. In order to form the n-type low-concentration impurity regions 257, the semiconductor layer 252 for the p-channel TFT is covered with a resist mask, and an impurity element is added into the semiconductor layer 251. Phosphorus or arsenic may be added as the impurity element. When the impurity element is added by an ion doping method or an ion implantation method, the gate electrode 255 serves as a mask, and the n-type low-concentration impurity regions 257 are formed in the semiconductor layer 251 in a self-aligned manner. A region of the semiconductor layer 251 which overlaps with the gate electrode 255 serves as a channel formation region 258.

Next, after the mask which covers the semiconductor layer 252 is removed, the semiconductor layer 251 for the n-channel TFT is covered with a resist mask. Then, the impurity element is added to the semiconductor layer 252 by an ion doping method or an ion implantation method. Boron can be added as the impurity element. At the step of adding the impurity element, the gate electrode 256 serves as a mask, and the p-type high-concentration impurity regions 259 are formed in the semiconductor layer 252 in a self-aligned manner. The p-type high-concentration impurity regions 259 serve as a source region and a drain region. A region of the semiconductor layer 252 which overlaps with the gate electrode 256 serves as a channel formation region 260. Note that, the method in which the p-type high-concentration impurity regions 259 are formed after the n-type low-concentration impurity regions 257 are formed is described here; however, the p-type high-concentration impurity regions 259 can be formed first.

Figure 5A:
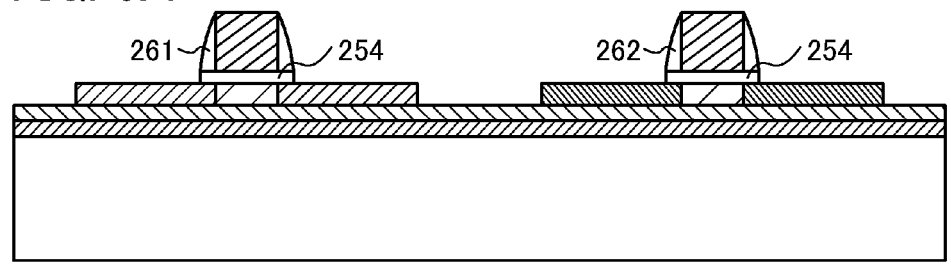
FIGS. 5A to 5C are views showing an example of a method of manufacturing a semiconductor device.

Next, after the resist which covers the semiconductor layer 251 is removed, an insulating film having a single layer structure of a nitrogen compound such as silicon nitride or an oxide such as silicon oxide or a stacked layer structure thereof is formed by a plasma CVD method or the like. This insulating film is anisotropically etched in a perpendicular direction to form sidewall insulating films 261 and 262 which are in contact with side faces of the gate electrodes 255 and 256 respectively, as shown in FIG. 5A. By this anisotropic etching, the insulating film 254 is also etched.

Figure 5B:
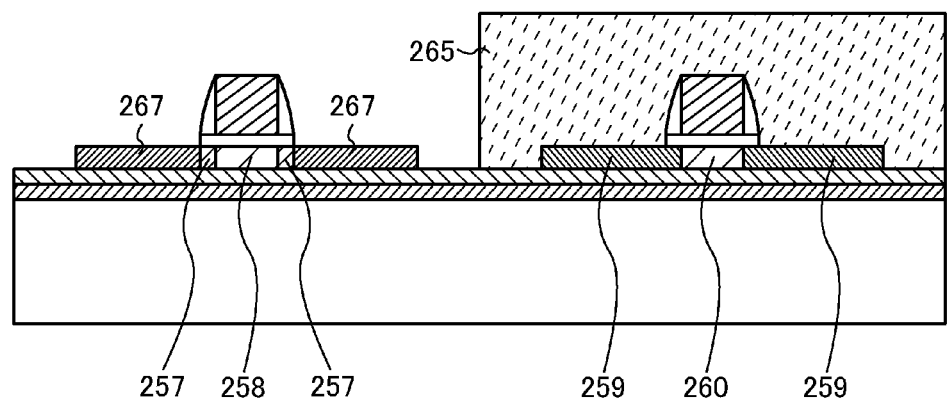

Next, as shown in FIG. 5B, the semiconductor layer 252 is covered with a resist 265. In order to form high-concentration impurity regions serving as a source region and a drain region in the semiconductor layer 251, an impurity element is added into the semiconductor layer 251 at a high dose by an ion implantation method or an ion doping method. The gate electrode 255 and the sidewall insulating film 261 serve as masks, and n-type high-concentration impurity regions 267 are formed.

Next, heat treatment (second heat treatment) for activating the impurity elements is performed. In this embodiment, the heat temperature of the semiconductor layer 251 and the semiconductor layer 252 for the second heat treatment is preferably set to be 550° C. or higher, and to be lower than the temperature of the first heat treatment. Note that the temperature of the first heat treatment is set to be 640° C. or higher, more preferably 700° C. or higher and to be temperature at which the single crystal semiconductor layer 124 is not melted and to be lower than the strain point of the base substrate 120.

Figure 5C:
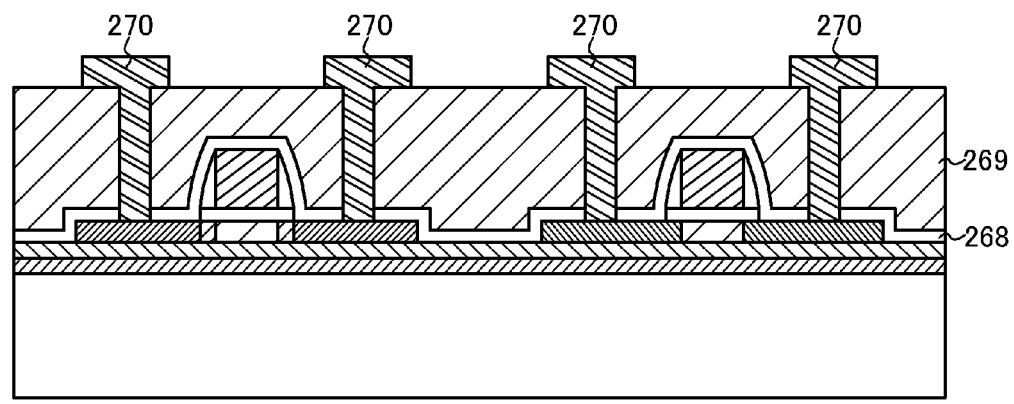

After the heat treatment for activation, an insulating film 268 containing hydrogen is formed as shown in FIG. 5C. After the insulating film 268 is formed, heat treatment is performed at a temperature of 350° C. to 470° C. inclusive, hydrogen contained in the insulating film 268 is diffused into the semiconductor layers 251 and 252. The insulating film 268 can be formed by deposition of silicon nitride or silicon nitride oxide by a plasma CVD method at a process temperature of 350° C. or lower. By supplying hydrogen to the semiconductor layers 251 and 252, defects which can serve as trapping centers in the semiconductor layers 251 and 252 and at an interface with the insulating film 254 can be effectively compensated.

After that, an interlayer insulating film 269 is formed. The interlayer insulating film 269 can be formed of a film having a single layer structure or a stacked layer structure of any one or more of films selected from an insulating film containing an inorganic material, such as a silicon oxide film or a borophosphosilicate glass (BPSG) film, and an organic resin film containing polyimide, acrylic, or the like. After contact holes are provided in the interlayer insulating film 269, wirings 270 are provided as shown in FIG. 5C. The wirings 270 can be formed of a conductive film having a three-layer structure in which a low-resistance metal film such as an aluminum film or an aluminum-alloy film is sandwiched between barrier metal films. The barrier metal films can be formed using metal films such as include molybdenum, chromium, or titanium.

Through the above steps, a semiconductor device having the n-channel TFT and the p-channel TFT can be manufactured. Since the oxygen concentration of the semiconductor layer in which the channel formation region is formed is reduced in the manufacturing process of the SOI substrate, a TFT in which off current is small and variation of the threshold voltage is suppressed can be manufactured. In addition, the oxygen concentration of the semiconductor layer in which the channel formation region is formed is set to be lower than $1\times10^{18}$ atoms/cm$^3$, preferably lower than $5\times10^{17}$ atoms/cm$^3$.

Although the method of manufacturing the TFT is described with reference to FIGS. 4A to 4D and FIGS. 5A to 5C in the above description, a semiconductor device with high added value can be manufactured by forming a variety of semiconductor elements such as a capacitor and a resister together with a TFT. Hereinafter, specific modes of semiconductor devices will be described with reference to drawings.

Figure 6:
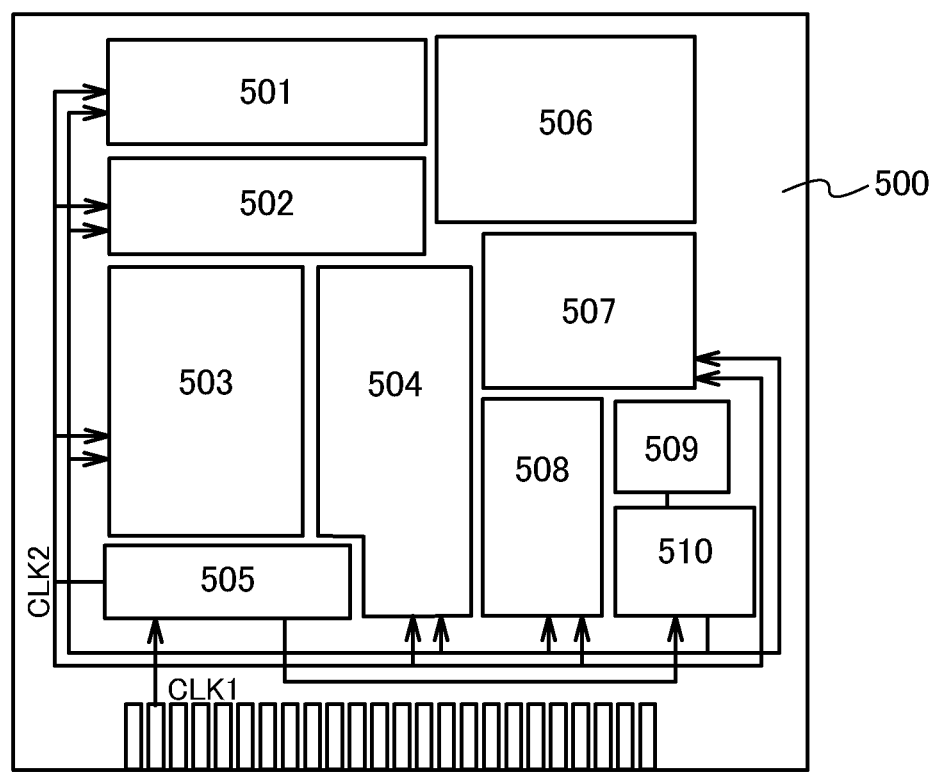
FIG. 6 is a diagram showing an example of a semiconductor device.

First, a microprocessor will be described as an example of a semiconductor device. FIG. 6 is a block diagram showing a configuration example of a microprocessor 500.

The microprocessor 500 has an arithmetic logic unit (also referred to as an "ALU") 501, an arithmetic logic unit controller (ALU controller) 502, an instruction decoder 503, an interrupt controller 504, a timing controller 505, a register 506, a register controller 507, a bus interface (Bus I/F) 508, a read only memory 509, and a memory interface 510.

An instruction input to the microprocessor 500 through the bus interface 508 is input to the instruction decoder 503 and decoded. Then, the instruction is input to the ALU controller 502, the interrupt controller 504, the register controller 507, and the timing controller 505. The ALU controller 502, the interrupt controller 504, the register controller 507, and the timing controller 505 perform various controls based on the decoded instruction.

The ALU controller 502 generates a signal for controlling the operation of the arithmetic logic unit 501. While the microprocessor 500 is executing a program, the interrupt controller 504 judges an interrupt request from an external input and output device or a peripheral circuit based on its priority or a mask state. The register controller 507 generates an address of the register 506, and reads/writes data from/to the register 506 in accordance with the state of the microprocessor 500. The timing controller 505 generates signals for controlling timing of driving of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1. As shown in FIG. 6, the internal clock signal CLK2 is input to another circuit.

Figure 7:
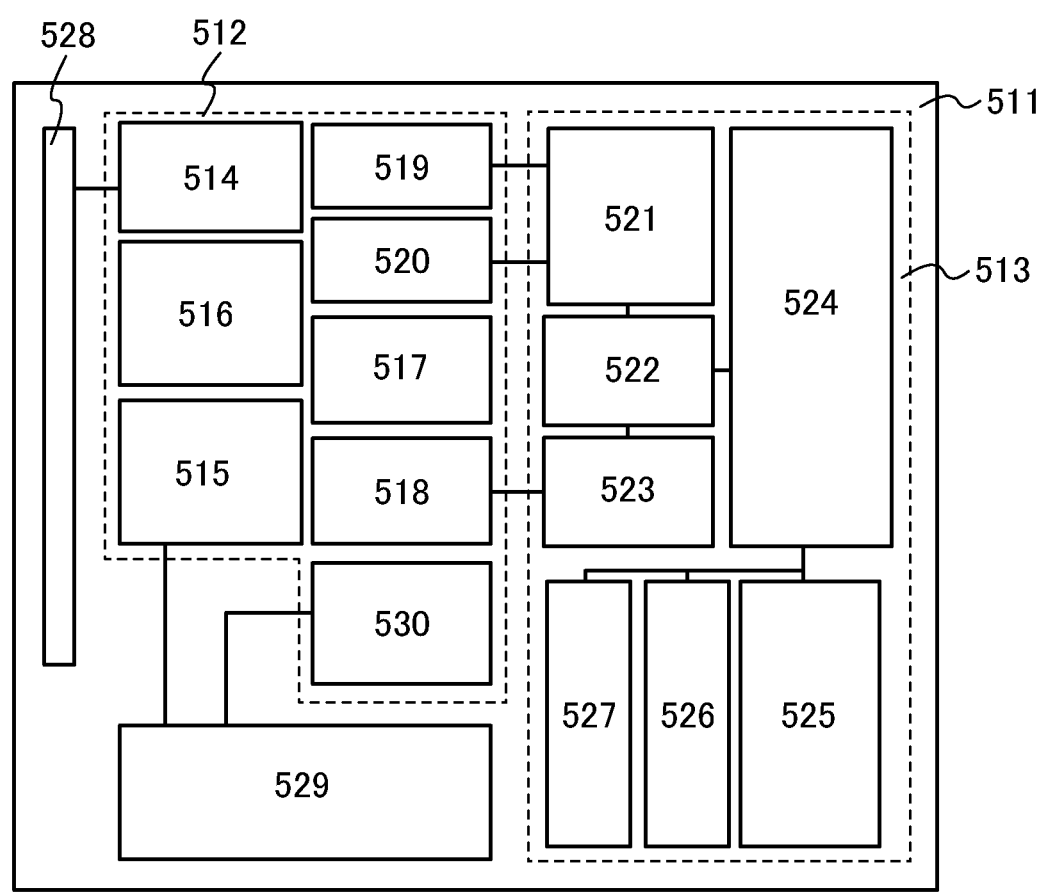
FIG. 7 is a diagram showing an example of a semiconductor device.

Next, an example of a semiconductor device having a function of communicating data wirelessly and also having an arithmetic function will be described. FIG. 7 is a block diagram showing a configuration example of such a semiconductor device. The semiconductor device shown in FIG. 7 can be referred to as a computer which operates by transmitting and receiving signals to and from an external device by wireless communication (hereinafter, referred to as an "RFCPU").

As shown in FIG. 7, the RFCPU 511 has an analog circuit portion 512 and a digital circuit portion 513. The analog circuit portion 512 has a resonance circuit 514 having a resonant capacitor, a rectifier circuit 515, a constant voltage circuit 516, a reset circuit 517, an oscillator circuit 518, a demodulation circuit 519, and a modulation circuit 520. The digital circuit portion 513 has an RF interface 521, a control register 522, a clock controller 523, a CPU interface 524, a central processing unit 525, a random access memory 526, and a read only memory 527.

The operation of the RFCPU 511 is roughly described below. The resonance circuit 514 generates induced electromotive force based on a signal received by an antenna 528. The induced electromotive force is stored in a capacitor portion 529 via the rectifier circuit 515. The capacitor portion 529 is preferably formed using a capacitor such as a ceramic capacitor or an electric double layer capacitor. The capacitor portion 529 is not necessarily integrated over the same substrate as the RFCPU 511 and may be incorporated into the RFCPU 511 as another component.

The reset circuit 517 generates a signal that resets the digital circuit portion 513 to be initialized. For example, the reset circuit generates a signal which rises with delay after rise in the supply voltage, as a reset signal. The oscillator circuit 518 changes the frequency and the duty ratio of a clock signal in accordance with a control signal generated by the constant voltage circuit 516. The demodulation circuit 519 demodulates a received signal, and the modulation circuit 520 modulates data to be transmitted.

For example, the demodulation circuit 519 is formed using a low-pass filter and binarizes a received signal of an amplitude shift keying (ASK) system based on variation of the amplitude. The modulation circuit 520 transmits transmission data by changing the amplitude of a transmission signal of the amplitude shift keying (ASK) system. The modulation circuit 520 changes the resonance point of the resonance circuit 514, whereby the amplitude of a communication signal is changed.

The clock controller 523 generates a control signal for changing the frequency and the duty ratio of the clock signal in accordance with the power supply voltage or current consumption in the central processing unit 525. The power supply voltage is monitored by the power supply control circuit 530.

A signal that is input to the RFCPU 511 from the antenna 528 is demodulated by the demodulation circuit 519, and then divided into a control command, data, and the like by the RF interface 521. The control command is stored in the control register 522. The control command includes reading of data stored in the read only memory 527, writing of data to the random access memory 526, an arithmetic instruction to the central processing unit 525, and the like.

The central processing unit 525 accesses the read only memory 527, the random access memory 526, and the control register 522 via the CPU interface 524. The CPU interface 524 has a function of generating an access signal for any one of the read only memory 527, the random access memory 526, and the control register 522 based on an address requested by the central processing unit 525.

As an arithmetic method of the central processing unit 525, a method may be employed in which the read only memory 527 stores an operating system (OS) and a program is read at the time of starting operation and then executed. Alternatively, a method in which a circuit dedicated to arithmetic is provided and an arithmetic process is conducted using hardware may be employed. In a method in which both hardware and software are used, part of arithmetic processing can be conducted by a circuit dedicated to arithmetic, and the other part of the arithmetic processing can be conducted by the central processing unit 525 using a program.

Next, a display device will be described with reference to FIGS. 8A and 8B and FIGS. 9A and 9B.

Figure 8A:
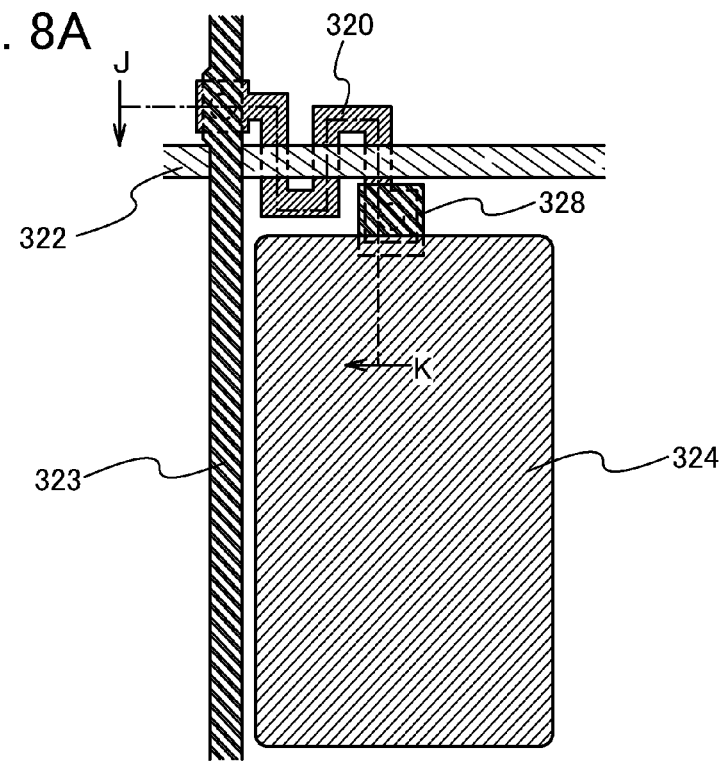
FIGS. 8A and 8B are views showing an example of a display device using a semiconductor device.
Figure 8B:
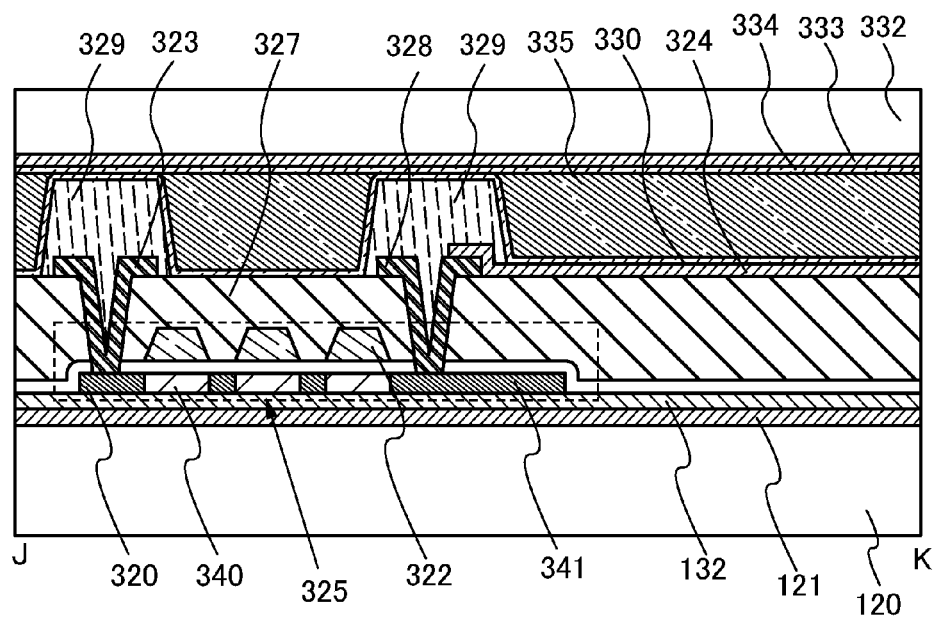

FIGS. 8A and 8B are drawings for describing a liquid crystal display device. FIG. 8A is a plan view of a pixel of a liquid crystal display device, and FIG. 8B is a cross-sectional view taken along a line J-K in FIG. 8A.

As shown in FIG. 8A, the pixel has a single crystal semiconductor layer 320, a scanning line 322 intersecting with the single crystal semiconductor layer 320, a signal line 323 intersecting with the scanning line 322, a pixel electrode 324, and an electrode 328 which electrically connects the pixel electrode 324 with the single crystal semiconductor layer 320. The single crystal semiconductor layer 320 is a layer formed of a single crystal semiconductor layer provided over the base substrate 120 and forms a TFT 325 of the pixel.

As an SOI substrate, the SOI substrate described in any of the above embodiments is used. As shown in FIG. 8B, a single crystal semiconductor layer 320 is provided over the base substrate 120 with the oxide film 132 and the nitrogen-containing layer 121 interposed therebetween. As the base substrate 120, a glass substrate can be used. The single crystal semiconductor layer 320 of the TFT 325 is formed by etching a single crystal semiconductor layer of the SOI substrate for element isolation. A channel formation region 340 and n-type high-concentration impurity regions 341 to which an impurity element is added are formed in the single crystal semiconductor layer 320. A gate electrode of the TFT 325 is included in the scanning line 322 and one of a source electrode and a drain electrode of the TFT 325 is included in the signal line 323.

The signal line 323, the pixel electrode 324, and the electrode 328 are provided over the interlayer insulating film 327. Over the interlayer insulating film 327, columnar spacers 329 are formed. An orientation film 330 is formed to cover the signal line 323, the pixel electrode 324, the electrode 328, and the columnar spacers 329. A counter substrate 332 is provided with a counter electrode 333 and an orientation film 334 which covers the counter electrode. The columnar spacers 329 are formed to keep the space between the base substrate 120 and the counter substrate 332. A liquid crystal layer 335 is formed in the space formed by the columnar spacers 329.

The interlayer insulating film 327 has a step at the connection portion between the high-concentration impurity regions 341, and the signal line 323 and the electrode 328 due to formation of contact holes; therefore, orientation of liquid crystals in the liquid crystal layer 335 is easily disordered at this connection portion. Therefore, the columnar spacers 329 are formed at these step portions to prevent disorder of liquid crystal orientation.

Figure 9A:
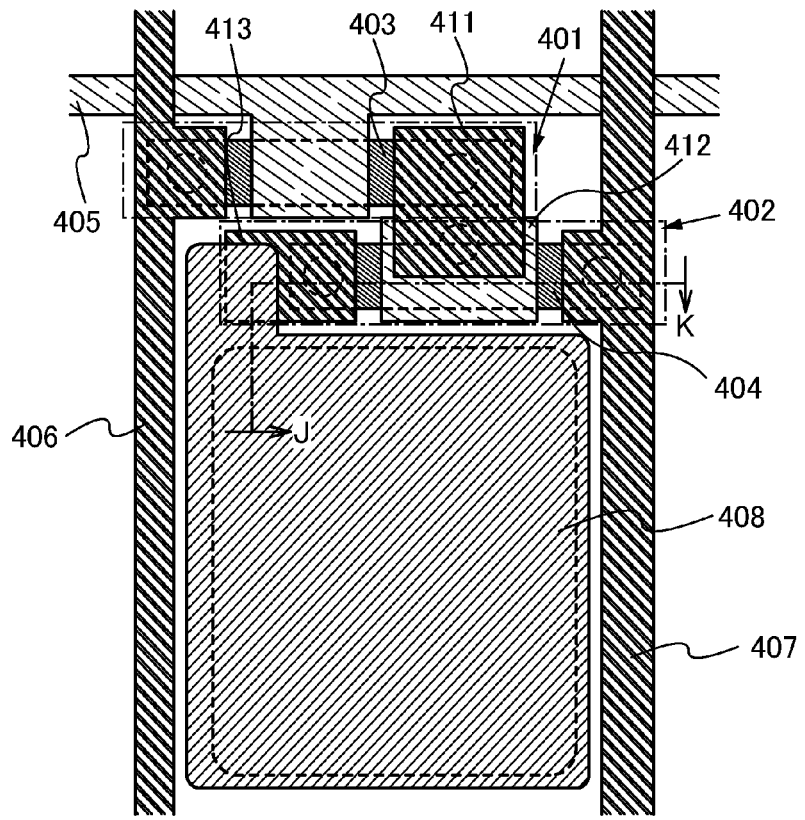
FIGS. 9A and 9B are views showing an example of a display device using a semiconductor device.
Figure 9B:
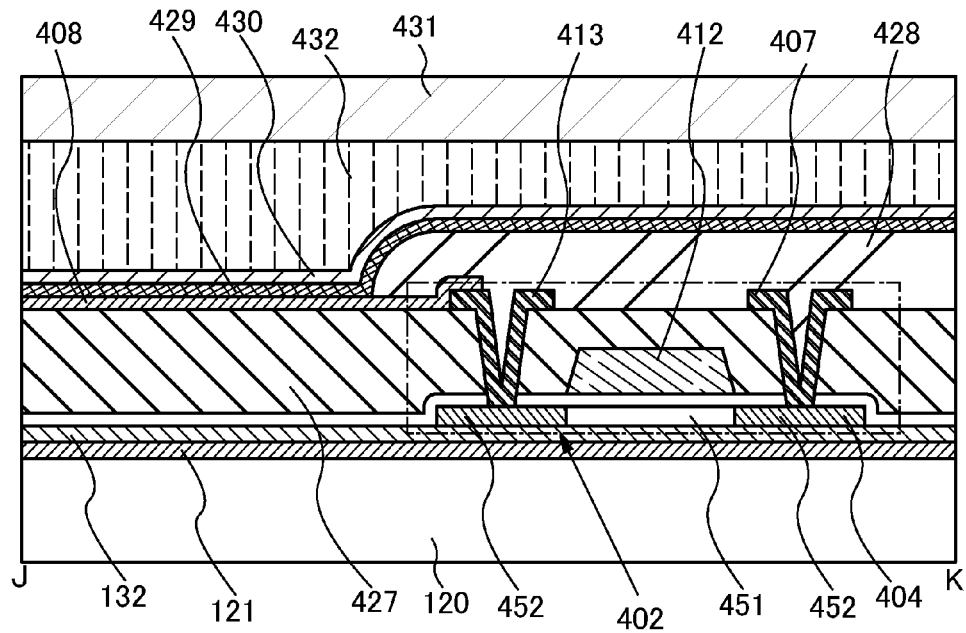

Next, an electroluminescent display device (hereinafter referred to as an EL display device) is described with reference to FIGS. 9A and 9B. FIG. 9A is a plan view of a pixel of an EL display device. FIG. 9B is a cross-sectional view taken along a line J-K of FIG. 9A.

As shown in FIG. 9A, the pixel includes a selection transistor 401 and a display control transistor 402 which are each a TFT, a scanning line 405, a signal line 406, a current supply line 407, and a pixel electrode 408. Each pixel is provided with a light-emitting element having a structure in which a layer including an electroluminescent material (an EL layer) is sandwiched between a pair of electrodes. One electrode of the light emitting element is the pixel electrode 408. Further, a semiconductor layer 403 forms a channel formation region, a source region, and a drain region of the selection transistor 401. A semiconductor layer 404 forms a channel formation region, a source region, and a drain region of the display control transistor 402. The semiconductor layers 403 and 404 are layers formed of the single crystal semiconductor layer 124 provided over the base substrate.

In the selection transistor 401, a gate electrode is included in the scanning line 405, one of a source electrode and a drain electrode is included in the signal line 406, and the other thereof is formed as an electrode 410. In the display control transistor 402, a gate electrode 412 is electrically connected to the electrode 411, one of a source electrode and a drain electrode is formed as an electrode 413 which is electrically connected to the pixel electrode 408, and the other thereof is included in the current supply line 407.

The display control transistor 402 is a p-channel TFT. As shown in FIG. 9B, a channel formation region 451 and p-type high-concentration impurity regions 452 are formed in the semiconductor layer 404. As an SOI substrate, the SOI substrate manufactured in any or the above embodiments is used.

An interlayer insulating film 427 is formed to cover the gate electrode 412 of the display control transistor 402. Over the interlayer insulating film 427, the signal line 406, the current supply line 407, the electrodes 411 and 413, and the like are formed. Over the interlayer insulating film 427, the pixel electrode 408 which is electrically connected to the electrode 413 is formed. A peripheral portion of the pixel electrode 408 is surrounded by a partition layer 428 having an insulating property. The EL layer 429 is formed over the pixel electrode 408, and a counter electrode 430 is formed over the EL layer 429. A counter substrate 431 is provided as a reinforcing plate and is fixed to the base substrate 120 by a resin layer 432.

The gray scale of the EL display device can be controlled by a current driving method in which luminance of a light-emitting element is controlled by current or a voltage driving method in which luminance of a light-emitting element is controlled by voltage. In the case where there is a large difference in the characteristic value between transistors of pixels, it is difficult to employ the current driving method; in order to employ the current driving method in such a case, a correction circuit which corrects characteristic variation is needed. An EL display device using a manufacturing process of an SOI substrate is manufactured, whereby the selection transistor 401 and the display control transistor 402 do not have variations in characteristics of each pixel, and thus it becomes possible to employ the current driving method.

Namely, various electric appliances can be manufactured using SOI substrates. The electronic appliances include, in its category, cameras such as video cameras, digital cameras, navigation systems, audio reproducing devices (such as car audios or audio components), computers, game machines, portable information terminals (such as mobile computers, mobile phones, portable game machines, or e-book readers), and devices provided with display devices capable of playing audio data stored in recording media and displaying stored image data such as image reproducing devices provided with recording media (specifically, digital versatile disk (DVD)). Specific examples of them are shown in FIGS. 10A to 10C.

Figure 10A:
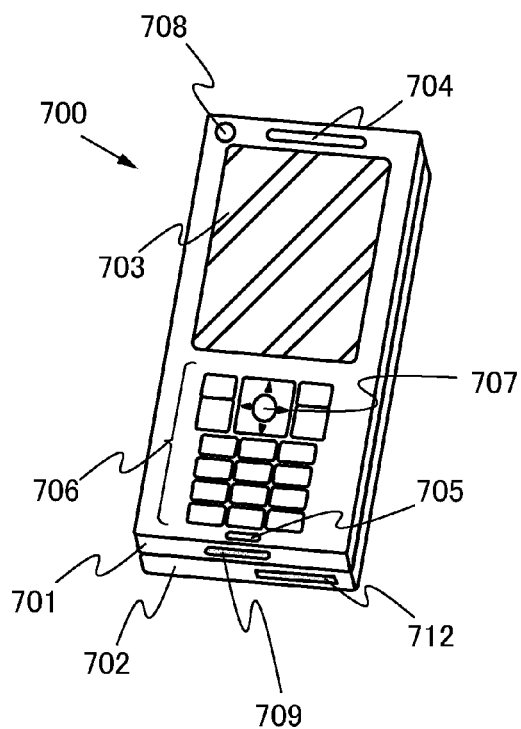
FIGS. 10A to 10C are views showing an electronic device using a semiconductor device.
Figure 10B:
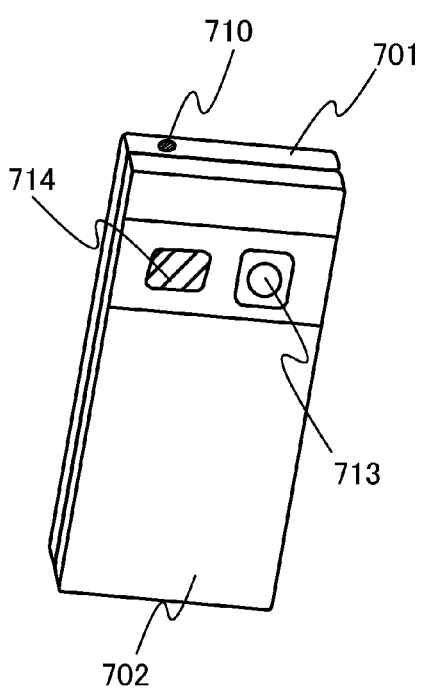
Figure 10C:
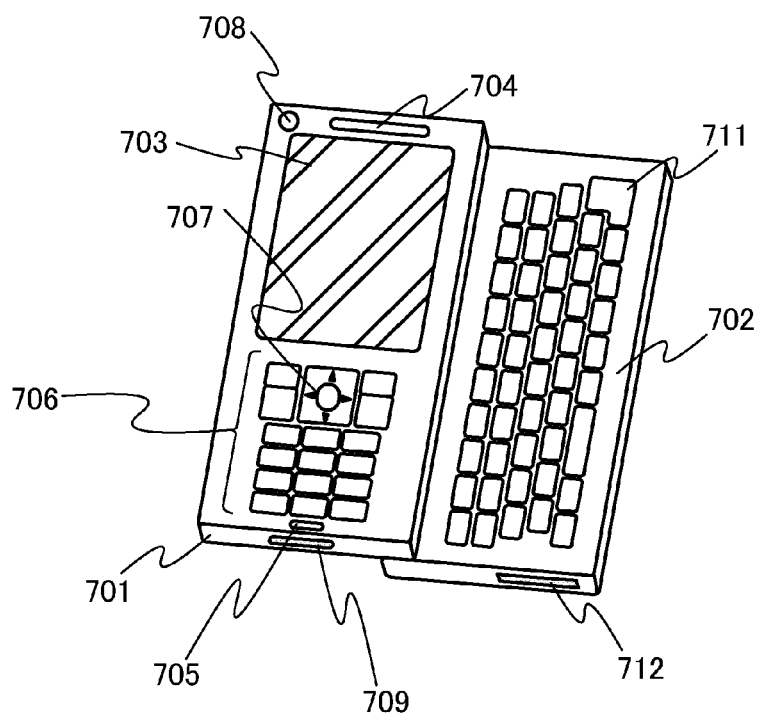

FIGS. 10A to 10C show an example of a mobile phone to which one embodiment of the invention disclosed is applied. FIG. 10A is a front view, FIG. 10B is a rear view, and FIG. 10C is a front view in which two chassis are slid. A mobile phone 700 has two chassis, a chassis 701 and a chassis 702. The mobile phone 700 has both functions of a mobile phone and a portable information terminal, and incorporates a computer, and is capable of a variety of data processing in addition to voice calls; therefore, it is called a smartphone.

The chassis 701 includes a display portion 703, a speaker 704, a microphone 705, operation keys 706, a pointing device 707, a front camera lens 708, an external connection terminal jack 709, an earphone terminal 710, and the like. The chassis 702 includes a keyboard 711, an external memory slot 712, a rear camera 713, a light 714, and the like. In addition, an antenna is incorporated in the chassis 701.

Further, in addition to the above structure, the mobile phone 700 may incorporate a non-contact IC chip, a small memory device, or the like.

The chassis 701 and 702 which overlap with each other (shown in FIG. 10A) can be slid, and are slid to be developed as illustrated in FIG. 10C. The display panel or the display device that is manufactured according to any of the methods of manufacturing a display device in Embodiments 2 and 3 can be incorporated in the display portion 703. Since the front camera lens 708 is provided in the same plane as the display portion 703, the mobile phone can be used as a videophone. Further, a still image and a moving image can be taken with the rear camera 713 and the light 714, using the display portion 703 as a viewfinder.

With the use of the speaker 704 and the microphone 705, the mobile phone 700 can be used as an audio recording device (recording device) or an audio playing device. With the use of the operation keys 706, further, operations of incoming and outgoing of calls, simple information input such as electronic mail, scrolling of a screen displayed in the display portion, cursor movement, e.g. for selecting information to be displayed in the display portion, and the like are possible.

If much information needs to be treated in documentation, a use as a portable information terminal, and the like, it is convenient to use the keyboard 711. By sliding the chassis 701 and 702 which overlap with each other (see FIG. 10A), the chassis 701 and 702 can be slid as shown in FIG. 10C. In the case the mobile phone 700 is used as a portable information terminal, a cursor can be moved smoothly with use of the keyboard 711 and the pointing device 707. The external connection terminal jack 709 can be connected to an AC adapter or a variety of cables such as a USB cable, so that charging and data communication with a personal computer or the like are possible. Further, by inserting a recording medium in the external memory slot 712, a larger amount of data can be stored and transferred.

The rear surface of the chassis 702 (see FIG. 10B) includes the rear camera 713 and the light 714, and a still image and a moving image can be taken using the display portion 703 as a viewfinder.

Further, in addition to the above-described functions and structures, the mobile phone 700 may have an infrared communication function, a USB port, a function of receiving one segment television broadcast, a non-contact IC chip, an earphone jack, or the like.

A variety of electronic appliances described in FIGS. 10A to 10C can be manufactured according to the above method of manufacturing a transistor and a display device.

Note that the structure described in this embodiment can be employed by being combined as appropriate with any structure in the other embodiments in this specification.

Example 1

In this example, characteristics of semiconductor devices which are manufactured according to one embodiment of the invention disclosed were observed. In particular, off currents (pA), on/off ratios, and S values (V/dec.) of thin film transistors were measured.

Samples in this example were manufactured using an SOI substrate having a structure where a single crystal silicon layer was provided over a glass substrate with a silicon oxide film formed of HCl oxidation interposed therebetween. The channel length (L) of the transistors was 10 μm and the channel width (W) thereof was 8 μm. In addition, for a gate insulating film, a stacked structure of a silicon oxide film (a thickness of 10 nm) and a silicon oxynitride film (a thickness of 10 nm) by radical oxidation was employed.

In the above manufacturing process of the transistors, a plurality of conditions of irradiation energy density of the laser beam, heat treatment after the laser irradiation (first heat treatment), and heat treatment in activating impurities (second heat treatment) were prepared and characteristics of each transistor were measured. As conditions of the irradiation energy density of the laser beam, three conditions were prepared: a condition where it is considered that the best characteristics can be obtained (Ref), a weaker energy condition (Ref−10 mJ/cm$^2$), a much weaker energy condition (Ref−20 mJ/cm$^2$). As conditions of the heat treatment after the laser irradiation (the first heat treatment), three conditions, 600° C., 640° C. and 700° C. were prepared. As conditions of the heat treatment in activating impurities (the second heat treatment), a plurality of conditions in accordance with the conditions of the heat treatment after the laser irradiation (the first heat treatment) were prepared. More specifically, in the case where the condition of the first heat treatment is 600° C., four conditions, 450° C., 480° C., 550° C. and 600° C. were prepared. In the case where the condition of the first heat treatment is 640° C., three conditions, 450° C., 550° C. and 600° C. were prepared. In the case where the condition of the first heat treatment is 700° C., three conditions, 450° C., 550° C. and 650° C. were prepared.

Figure 11A:
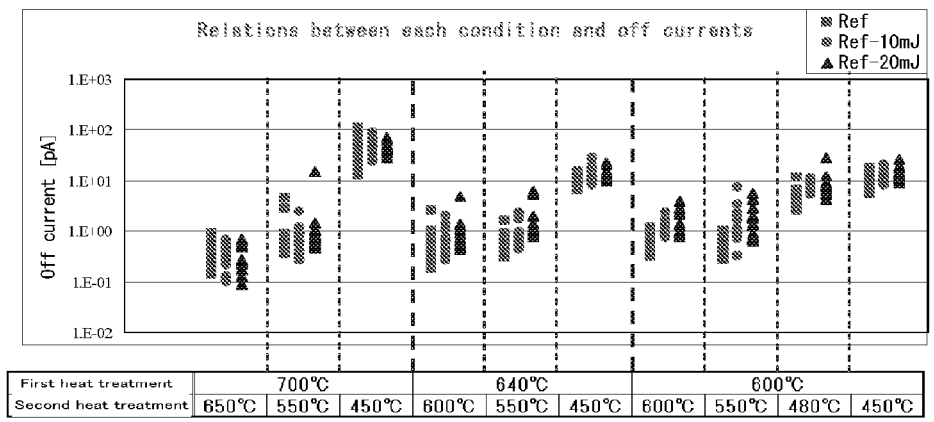
FIGS. 11A to 11C are graphs for comparing characteristics of semiconductor devices manufactured under various conditions.
Figure 11B:
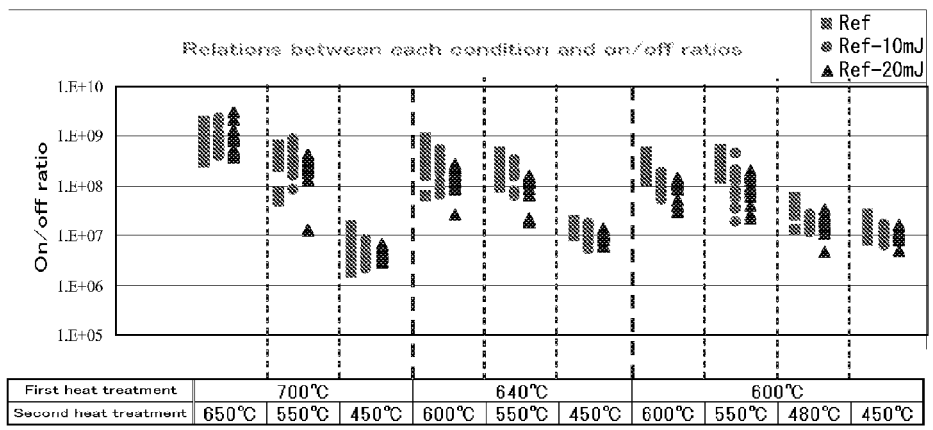
Figure 11C:
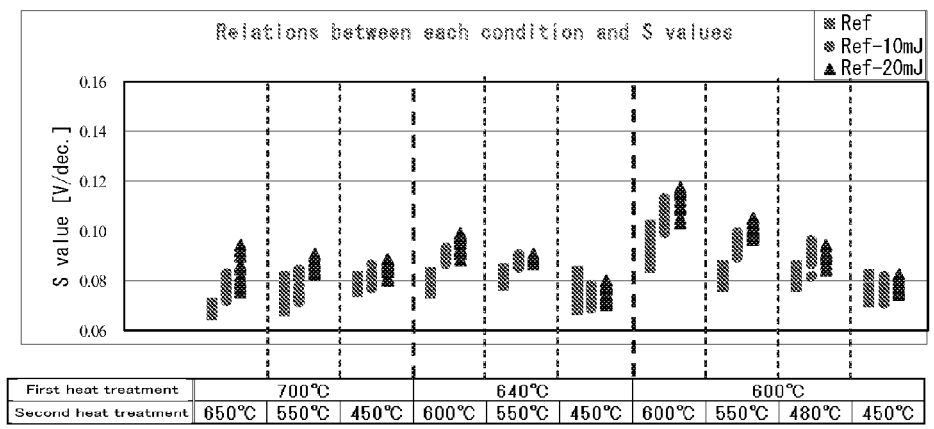

Relations between the above-described conditions, and the off currents, the on/off ratios and the S values are shown in FIGS. 11A to 11C. FIG. 11A shows the relations between each condition and the off currents, FIG. 11B shows the relations between each condition and the on/off ratios, and FIG. 11C shows the relations between each condition and the S values.

FIG. 11A shows that the off currents become approximately 10 pA or less only in the cases where the temperature of the second heat treatment is 550° C. or higher. Further, as the temperature of the second heat treatment becomes higher, the off current tends to be reduced.

FIG. 11B shows that the on/off ratios become approximately $10^7$ or higher, only in the cases where the temperature of the second heat treatment is 550° C. or higher. Further as the temperature of the second heat treatment becomes higher, the on/off ratio tends to be increased. FIG. 11A and FIG. 11B show that there is a strong correlation between the off currents and the on/off ratios.

FIG. 11C shows that the S values become approximately 0.1V/dec. or less, only in the cases where the temperature of the first heat treatment is 640° C. or higher, or where the temperature of the first heat treatment is 600° C. and that of the second heat treatment is lower than 550° C. This indicates that the temperature of the second heat treatment should be lower than that of the first heat treatment.

As described above, it was found that the temperature of the first heat treatment is set to be higher than 600° C. (preferably, 640° C. or higher, more preferably, 700° C. or higher) and that of the second heat treatment is set to be 550° C. or higher and to be lower than that of the first heat treatment, whereby favorable element characteristics can be obtained.

Further, it is found that in the above conditions, irradiation-energy-density dependence of the element characteristics is sufficiently low. That is, by employing the above conditions, a semiconductor device in which variations in element characteristics due to variations in energy density of laser beams are sufficiently reduced can be provided.

The structure described in this example can be employed by being combined as appropriate with any structure in other embodiments in this specification.

Example 2

Figure 12A:
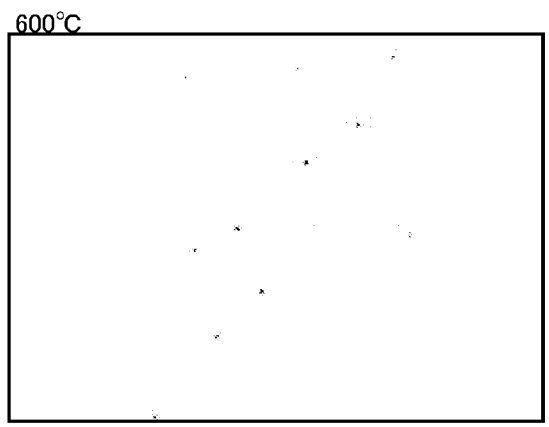
FIGS. 12A to 12C are diagrams showing a state where crystallinity is recovered by heat treatment at high temperature.
Figure 12B:
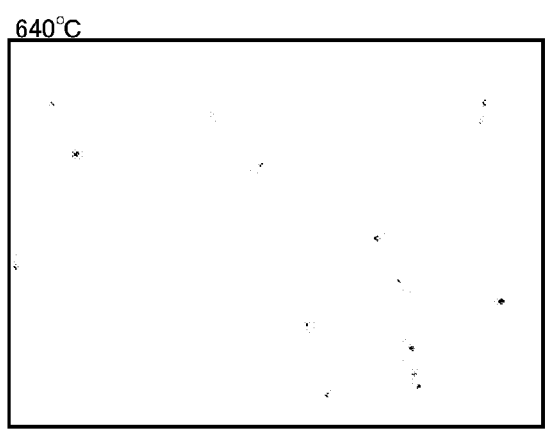
Figure 12C:
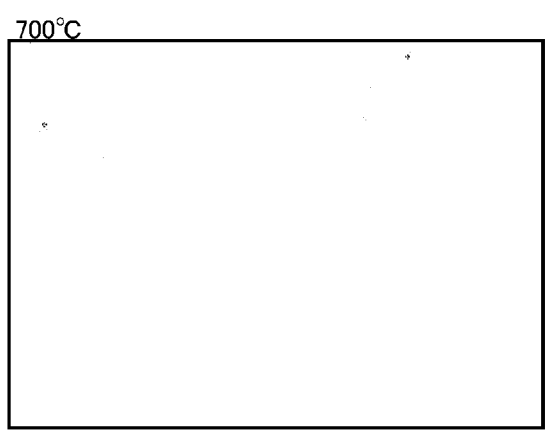

In this example, a state where crystallinity had been recovered by heat treatment was confirmed with plane-view TEM (transmission electron microscope) images. Samples are the same as those used in Example 1. The above plane-view TEM image is shown in FIGS. 12A to 12C. Note that contrasts of FIGS. 12A and 12C are adjusted in order to confirm states of defects easily. In addition, the black spots in FIG. 12A to 12C are defects in the semiconductor layer.

FIG. 12A is a plane-view TEM image after the heat treatment was performed at 600° C., FIG. 12B is a plane-view TEM image after the heat treatment was performed at 640° C., and FIG. 12C is a plane-view TEM image after the heat treatment was performed at 700° C. Thus, it is found that as temperature of heat treatment is set to be higher, defects in a semiconductor layer is reduced.

The structure described in this example can be employed by being combined as appropriate with any structure in other embodiments in this specification.

This application is based on Japanese Patent Application serial no. 2008-228109 filed with Japan Patent Office on Sep. 5, 2008, the entire contents of which are hereby incorporated by reference.

What is claimed is:

1. A method of manufacturing a semiconductor device, comprising:
    irradiating a single crystal semiconductor substrate with ions to form an embrittlement region at a predetermined depth from a surface of the single crystal semiconductor substrate;
    attaching the single crystal semiconductor substrate to a base substrate with an insulating layer interposed therebetween;
    separating the single crystal semiconductor substrate at the embrittlement region to form a single crystal semiconductor layer over the base substrate with the insulating layer interposed therebetween;
    irradiating the single crystal semiconductor layer with a laser beam, so as to melt the single crystal semiconductor layer partially;
    performing first heat treatment on the single crystal semiconductor layer by one of a diffusion furnace, a heating furnace, and a rapid thermal annealing apparatus after irradiating the single crystal semiconductor layer with the laser beam;
    adding an impurity element imparting conductivity to the single crystal semiconductor layer to form impurity regions in the single crystal semiconductor layer after performing the first heat treatment; and
    performing second heat treatment on the single crystal semiconductor layer in which the impurity regions are formed at a temperature lower than that of the first heat treatment.

2. The method of manufacturing the semiconductor device according to claim 1, wherein the temperature of the second heat treatment is 550° C. or higher.

3. The method of manufacturing the semiconductor device according to claim 1, wherein the temperature of the first heat treatment is 640° C. or higher and lower than a strain point of the base substrate.

4. The method of manufacturing the semiconductor device according to claim 1, wherein the impurity regions are a source region and a drain region.

5. The method of manufacturing the semiconductor device according to claim 1, wherein a glass substrate is used as the base substrate.

6. A method of manufacturing a semiconductor device, comprising:
    irradiating a single crystal semiconductor substrate with ions to form an embrittlement region at a predetermined depth from a surface of the single crystal semiconductor substrate;
    attaching the single crystal semiconductor substrate to a base substrate with an insulating layer interposed therebetween;
    separating the single crystal semiconductor substrate at the embrittlement region to form a single crystal semiconductor layer over the base substrate with the insulating layer interposed therebetween;
    irradiating the single crystal semiconductor layer with a laser beam, so as to melt the single crystal semiconductor layer partially;
    performing first heat treatment on the single crystal semiconductor layer by one of a diffusion furnace, a heating furnace, and a rapid thermal annealing apparatus after irradiating the single crystal semiconductor layer with the laser beam;
    forming a gate electrode over the single crystal semiconductor layer with a gate insulating film interposed therebetween after performing the first heat treatment;
    adding an impurity element imparting conductivity to the single crystal semiconductor layer through the gate insulating film to form impurity regions in the single crystal semiconductor layer after forming the gate electrode; and
    performing second heat treatment on the single crystal semiconductor layer in which the impurity regions are formed at a temperature lower than that of the first heat treatment.

7. The method of manufacturing the semiconductor device according to claim 6, wherein the temperature of the second heat treatment is 550° C. or higher.

8. The method of manufacturing the semiconductor device according to claim 6, wherein the temperature of the first heat treatment is 640° C. or higher and lower than a strain point of the base substrate.

9. The method of manufacturing the semiconductor device according to claim 6, wherein the impurity regions are a source region and a drain region.

10. The method of manufacturing the semiconductor device according to claim 6, wherein a glass substrate is used as the base substrate.

11. A method of manufacturing a semiconductor device, comprising:
    irradiating a single crystal semiconductor substrate with ions to form an embrittlement region at a predetermined depth from a surface of the single crystal semiconductor substrate;
    attaching the single crystal semiconductor substrate to a base substrate with an insulating layer interposed therebetween;
    separating the single crystal semiconductor substrate at the embrittlement region to form a single crystal semiconductor layer over the base substrate with the insulating layer interposed therebetween;
    irradiating the single crystal semiconductor layer with a laser beam, so as to melt the single crystal semiconductor layer partially;
    thinning the single crystal semiconductor layer after irradiating the single crystal semiconductor layer with the laser beam;
    performing first heat treatment on the single crystal semiconductor layer by one of a diffusion furnace, a heating furnace, and a rapid thermal annealing apparatus after thinning the single crystal semiconductor layer;
    adding an impurity element imparting conductivity to the single crystal semiconductor layer to form impurity regions in the single crystal semiconductor layer after performing the first heat treatment; and
    performing second heat treatment on the single crystal semiconductor layer in which the impurity regions are formed at a temperature lower than that of the first heat treatment.

12. The method of manufacturing the semiconductor device according to claim 11, wherein the temperature of the second heat treatment is 550° C. or higher.

13. The method of manufacturing the semiconductor device according to claim 11, wherein the temperature of the first heat treatment is 640° C. or higher and lower than a strain point of the base substrate.

14. The method of manufacturing the semiconductor device according to claim 11, wherein the impurity regions are a source region and a drain region.

15. The method of manufacturing the semiconductor device according to claim 11, wherein a glass substrate is used as the base substrate.

16. The method of manufacturing the semiconductor device according to claim 11, wherein the step of thinning the single crystal semiconductor layer is performed by a dry etching method or a wet etching method.

17. A method of manufacturing a semiconductor device, comprising:
    irradiating a single crystal semiconductor substrate with ions to form an embrittlement region at a predetermined depth from a surface of the single crystal semiconductor substrate;
    attaching the single crystal semiconductor substrate to a base substrate with an insulating layer interposed therebetween;
    separating the single crystal semiconductor substrate at the embrittlement region to form a single crystal semiconductor layer over the base substrate with the insulating layer interposed therebetween;
    irradiating the single crystal semiconductor layer with a laser beam, so as to melt the single crystal semiconductor layer partially;
    thinning the single crystal semiconductor layer after irradiating the single crystal semiconductor layer with the laser beam;
    performing first heat treatment on the single crystal semiconductor layer by one of a diffusion furnace, a heating furnace, and a rapid thermal annealing apparatus after thinning the single crystal semiconductor layer;
    forming a gate electrode over the single crystal semiconductor layer with a gate insulating film interposed therebetween after performing the first heat treatment;
    adding an impurity element imparting conductivity to the single crystal semiconductor layer through the gate insulating film to form impurity regions in the single crystal semiconductor layer after forming the gate electrode; and
    performing second heat treatment on the single crystal semiconductor layer in which the impurity regions are formed at a temperature lower than that of the first heat treatment.

18. The method of manufacturing the semiconductor device according to claim 17, wherein the temperature of the second heat treatment is 550° C. or higher.

19. The method of manufacturing the semiconductor device according to claim 17, wherein the temperature of the first heat treatment is 640° C. or higher and lower than a strain point of the base substrate.

20. The method of manufacturing the semiconductor device according to claim 17, wherein the impurity regions are a source region and a drain region.

21. The method of manufacturing the semiconductor device according to claim 17, wherein a glass substrate is used as the base substrate.

22. The method of manufacturing the semiconductor device according to claim 17, wherein the step of thinning the single crystal semiconductor layer is performed by a dry etching method or a wet etching method.

* * * * *